United States Patent
Kato et al.

(10) Patent No.: US 9,748,625 B2
(45) Date of Patent: Aug. 29, 2017

(54) HIGH-FREQUENCY TRANSMISSION LINE AND ELECTRONIC DEVICE

(71) Applicant: Murata Manufacturing Co., Ltd., Nagaokakyo-shi, Kyoto-fu (JP)

(72) Inventors: Noboru Kato, Nagaokakyo (JP); Satoshi Ishino, Nagaokakyo (JP); Jun Sasaki, Nagaokakyo (JP); Kuniaki Yosui, Nagaokakyo (JP); Takahiro Baba, Nagaokakyo (JP); Nobuo Ikemoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/285,625

(22) Filed: Oct. 5, 2016

(65) Prior Publication Data

US 2017/0025731 A1 Jan. 26, 2017

Related U.S. Application Data

(63) Continuation of application No. 14/564,140, filed on Dec. 9, 2014, now Pat. No. 9,490,516, which is a (Continued)

(30) Foreign Application Priority Data

Jun. 28, 2012 (JP) .................................. 2012-144862
Jan. 22, 2013 (JP) .................................. 2013-009105

(51) Int. Cl.
*H01P 3/02* (2006.01)
*H01P 5/00* (2006.01)
(Continued)

(52) U.S. Cl.
CPC ................. *H01P 3/02* (2013.01); *H01P 3/082* (2013.01); *H01P 3/085* (2013.01); *H01P 5/00* (2013.01);
(Continued)

(58) Field of Classification Search
CPC .. H01P 3/02; H01P 3/082; H01P 3/085; H01P 5/00; H05K 1/0221; H05K 1/0237; H05K 1/028; H05K 1/14
(Continued)

(56) References Cited

U.S. PATENT DOCUMENTS 7,397,320 B1 * 7/2008 Bokhari .................. H01P 3/081
333/1
9,490,516 B2 * 11/2016 Kato ....................... H01P 3/085
(Continued)

OTHER PUBLICATIONS

Kato et al., "High-Frequency Transmission Line and Electronic Device", U.S. Appl. No. 14/564,140, filed Dec. 9, 2014.
(Continued)

*Primary Examiner* — Stephen E Jones
*Assistant Examiner* — Scott S Outten
(74) *Attorney, Agent, or Firm* — Keating & Bennett, LLP

(57) ABSTRACT

A transmission line portion of a flat cable includes first regions and second regions connected alternately. In the first region, the transmission line portion is a flexible tri-plate transmission line including a dielectric element including a signal conductor, a first ground conductor including opening portions, and a second ground conductor which is a solidly filled conductor. In the second region, the transmission line portion is a hard tri-plate transmission line including a wide dielectric element including a meandering conductor, and a first ground conductor and a second ground conductor which are solidly filled conductors. A variation width of the characteristic impedance in the second region is larger than a
(Continued)

variation width of the characteristic impedance in the first region.

17 Claims, 14 Drawing Sheets

Related U.S. Application Data continuation of application No. PCT/JP2013/067594, filed on Jun. 27, 2013.

(51) Int. Cl.
- *H05K 1/02* (2006.01)
- *H05K 1/14* (2006.01)
- *H01P 3/08* (2006.01)
- H05K 3/36 (2006.01)
- H01P 5/02 (2006.01)

(52) U.S. Cl.
CPC ......... *H05K 1/028* (2013.01); *H05K 1/0221* (2013.01); *H05K 1/0237* (2013.01); *H05K 1/14* (2013.01); *H01P 5/028* (2013.01); *H05K 1/025* (2013.01); *H05K 1/148* (2013.01); *H05K 3/361* (2013.01)

(58) Field of Classification Search
USPC .......................... 333/238, 749; 361/749, 238
See application file for complete search history.

(56) References Cited

U.S. PATENT DOCUMENTS

| | | | | |
|---|---|---|---|---|
| 2010/0141354 A1* | 6/2010 | Cho | .......................... | H01P 3/06 333/160 |
| 2012/0112857 A1* | 5/2012 | Lim | ...................... | H01P 1/2039 333/238 |
| 2013/0342410 A1* | 12/2013 | Wu | ........................ | H01P 3/003 343/767 |

OTHER PUBLICATIONS

Kato et al., "High-Frequency Transmission Line and Electronic Device", U.S. Appl. No. 15/614,640, filed Jun. 6, 2017.

\* cited by examiner

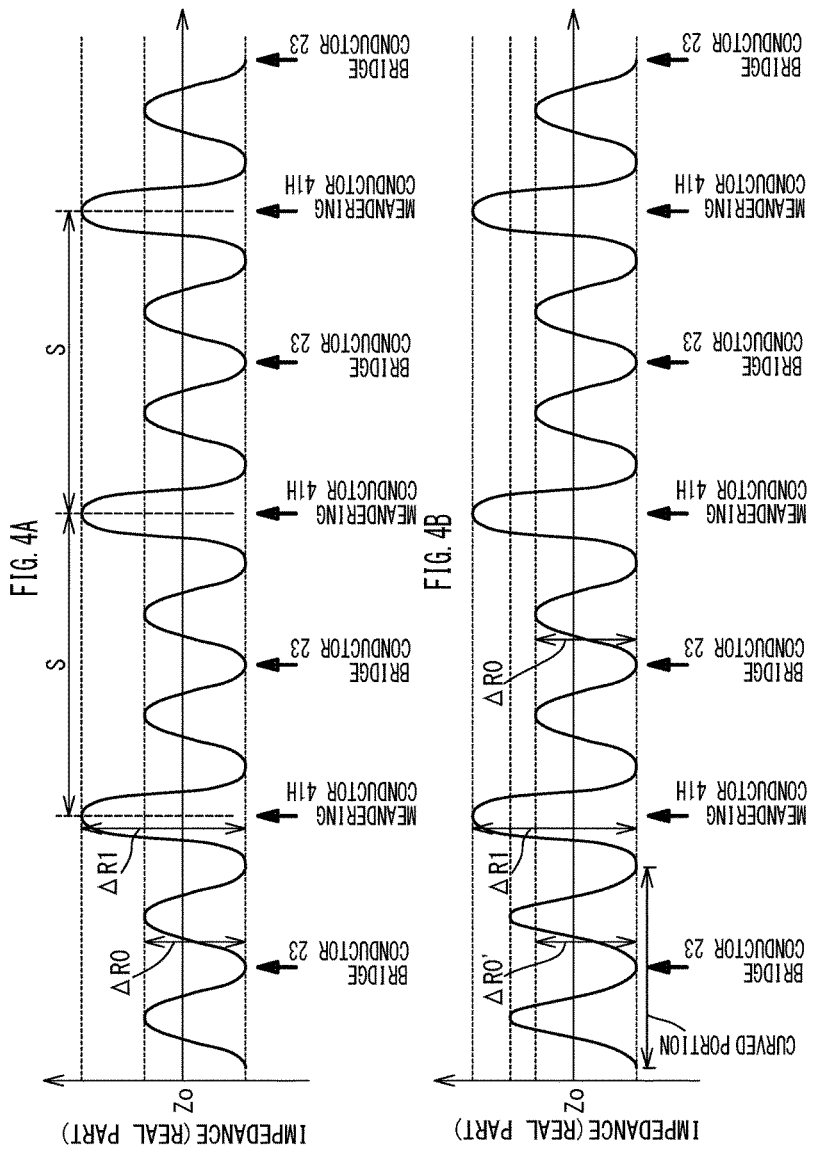

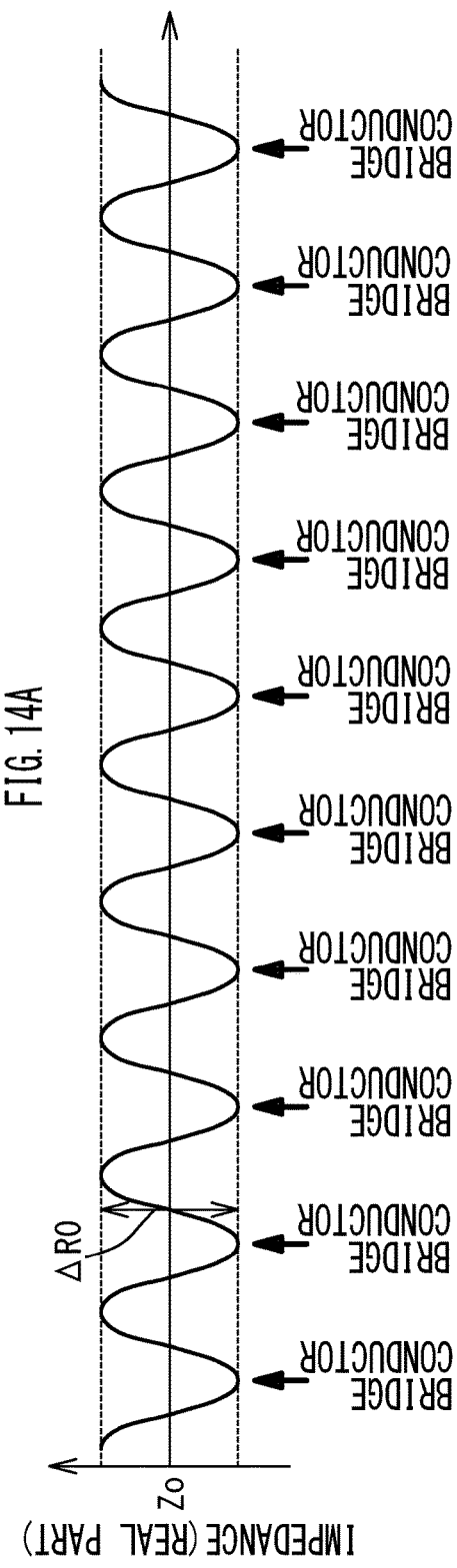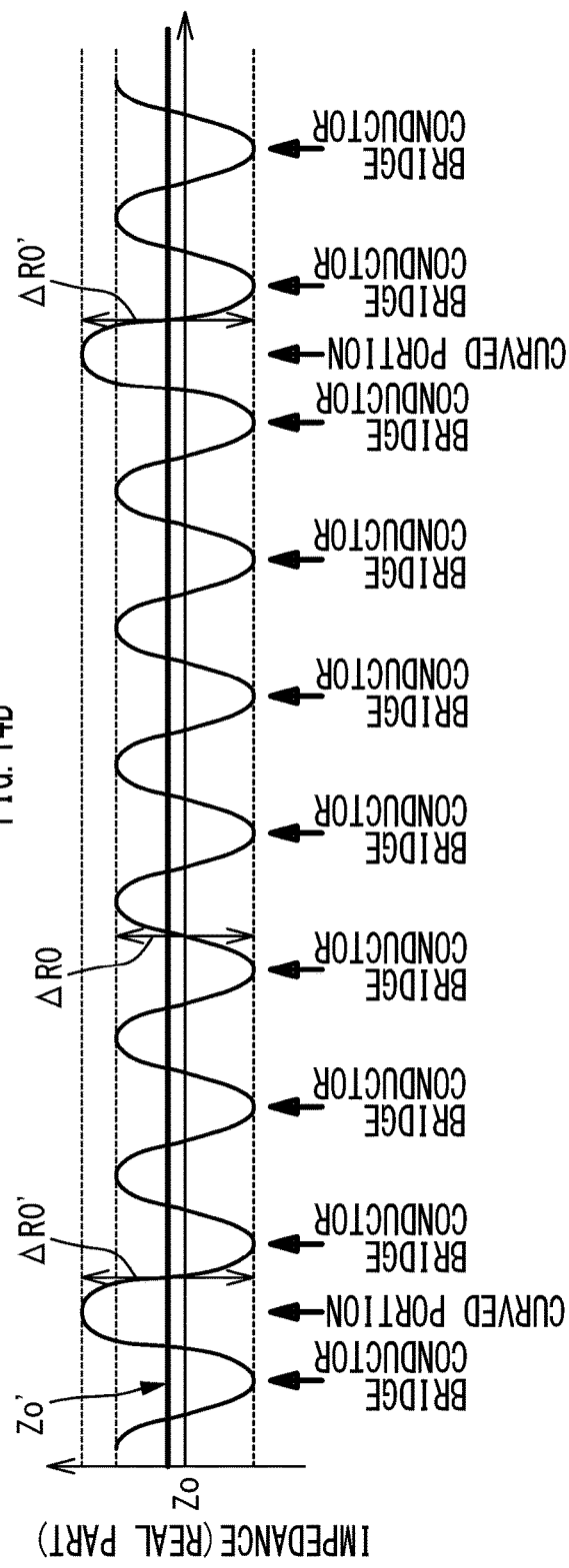

HIGH-FREQUENCY TRANSMISSION LINE AND ELECTRONIC DEVICE

BACKGROUND OF THE INVENTION

1. Field of the Invention

The present invention relates to a thin high-frequency transmission line for transmission of a high-frequency signal and an electronic device including the high-frequency transmission line.

2. Description of the Related Art

Typical examples of a high-frequency line for transmission of a high-frequency signal according to the related art include a coaxial cable. The coaxial cable includes a center conductor (signal conductor) configured to extend in one direction (configured to extend in the signal transmission direction), and a shield conductor provided concentrically along the outer peripheral surface of the center conductor.

In recent years, high-frequency devices including mobile communication terminals have been reduced in size and thickness, and a space for arrangement of the coaxial cable may not be secured in a terminal housing. In addition, the coaxial cable is hard, and thus not easily curved or bent to be routed.

Use of high-frequency transmission lines described in International Publication No. 2011/007660 and Japanese Registered Utility Model No. 3173143 is drawing attention to solve a problem that occurs when such a coaxial cable is utilized. The high-frequency transmission line is larger in width than the coaxial cable but can be thinned, and therefore is particularly useful in the case where there is only a small clearance in the terminal housing. In addition, the high-frequency transmission line has a flexible dielectric element as the base material, and thus is flexible and can be easily curved and bent to be routed.

The high-frequency transmission lines described in International Publication No. 2011/007660 and Japanese Registered Utility Model No. 3173143 have a tri-plate strip line structure as the basic structure.

The high-frequency transmission lines described in International Publication No. 2011/007660 and Japanese Registered Utility Model No. 3173143 include a flat-plate dielectric element that is flexible and insulating. The dielectric element has an elongated shape that extends straight. A second ground conductor is disposed on a second surface orthogonal to the thickness direction of the dielectric element. The second ground conductor has a so-called solidly filled conductor pattern in which the second surface of the base material sheet is covered generally entirely. A first ground conductor is disposed on a first surface of the base material sheet opposite to the second surface. The first ground conductor includes elongated conductors configured to extend along the longitudinal direction at both ends in the width direction orthogonal to the longitudinal direction and the thickness direction. The two elongated conductors are connected to each other by bridge conductors disposed at predetermined intervals along the longitudinal direction and configured to extend in the width direction. Thus, the first ground conductor is shaped such that opening portions with a predetermined opening length are formed and arranged along the longitudinal direction.

A signal conductor with a predetermined width and a predetermined thickness is formed in the middle of the dielectric element in the thickness direction. The signal conductor is elongated to extend in the direction parallel with the elongated conductor portions of the first ground conductor and the second ground conductor. The signal conductor is formed generally in the center of the dielectric element in the width direction.

When the thus configured high-frequency transmission line is viewed in plan (seen from a direction orthogonal to the first surface and the second surface), the signal conductor is disposed so as to overlap the first ground conductor only at the bridge conductors and be provided in the opening portions in other regions.

With such a shape, the high-frequency transmission lines having predetermined transmission characteristics can be thinned, and can be easily curved and bent to be routed. The terms "curve" and "bend" as used herein refer to three-dimensional deformation that causes the entire flat-plate surface of the high-frequency transmission lines not to be present on an identical plane. In other words, the terms relate to causing a bend by a predetermined angle with respect to the flat-plate surface of the high-frequency transmission lines.

However, the high-frequency transmission lines structured as discussed above have the following problem. FIGS. 14A and 14B are each a graph illustrating the distribution characteristics of characteristic impedance for explaining the problem with the high-frequency transmission line structured in accordance with the related art.

In the high-frequency transmission line according to the related art, the first ground conductor includes a plurality of opening portions provided along the longitudinal direction. Thus, the first ground conductor and the signal conductor face each other along the thickness direction only at the locations of installation of the bridge conductors. Therefore, a C property (capacitive property) becomes highest at the positions of the bridge conductors along the longitudinal direction, and an L property (inductive property) becomes highest in the middle of the opening portions.

Since the bridge conductors are disposed at predetermined intervals as discussed above, the characteristic impedance of the high-frequency transmission line according to the related art is cyclically varied in accordance with the interval of installation of the bridge conductors. Setting is made such that a desired characteristic impedance is obtained for the overall length of the high-frequency transmission line.

The characteristic impedance is set with the high-frequency transmission line not curved. Thus, with the high-frequency transmission line not curved, as illustrated in FIG. 14A, the characteristic impedance is varied in accordance with the interval of installation of the bridge conductors, and a desired characteristic impedance Zo is obtained for the overall length. In this event, the amplitude $\Delta R0$ of the real number of the characteristic impedance has a constant value.

In the case where the high-frequency transmission line is curved, however, the positional relationship between the signal conductor and the first ground conductor and the second ground conductor is varied at curved portions. In this case, the characteristic impedance at the curved portions is varied. Depending on the curved state, as illustrated in FIG. 14B, for example, the L property in an opening portion may be increased such that the amplitude $\Delta R0'$ of the real number of the characteristic impedance at the curved portions is larger than the amplitude $\Delta R0$ of the real number of the characteristic impedance at non-curved portions.

The characteristic impedance for the entire high-frequency transmission line greatly depends on the maximum value of the amplitude of the real number of the characteristic impedance. Thus, if the high-frequency transmission line is curved and the maximum value of the amplitude of the real number of the characteristic impedance is varied, the characteristic impedance for the entire high-frequency transmission line is also varied. For example, as illustrated in FIG. 14B, the characteristic impedance Z0' of the entire high-frequency transmission line with curved portions is different from the characteristic impedance Z0 of the entire high-frequency transmission line which is not curved. Therefore, the transmission loss of an RF signal may be increased to degrade the transmission characteristics.

SUMMARY OF THE INVENTION

Preferred embodiments of the present invention provide a high-frequency transmission line with an overall characteristic impedance that is hardly varied even if the high-frequency transmission line is partly curved in the thickness direction, and an electronic device.

A high-frequency transmission line according to a preferred embodiment of the present invention includes a dielectric element, a signal conductor, and a first ground conductor. The dielectric element is a flexible flat plate elongated in one direction, the flat plate having a predetermined width in a direction perpendicular or substantially perpendicular to a longitudinal direction and having a predetermined thickness. The signal conductor is disposed in the dielectric element, and configured to extend along the longitudinal direction. The first ground conductor opposes the signal line conductor and extends in the longitudinal direction.

At least one of the signal conductor and the first ground conductor has a characteristic impedance cyclically varied along the longitudinal direction, and includes a first region and a second region with different variation widths of the characteristic impedance. The variation width of the characteristic impedance in the second region is larger than the variation width of the characteristic impedance in the first region.

According to the configuration, the characteristic impedance in the second region is dominant in the characteristic impedance of the entire high-frequency transmission line. Thus, the characteristic impedance for the entire high-frequency transmission line is hardly varied if the first region is bent, because the characteristic impedance in the second region is not varied although the characteristic impedance in the first region is varied.

A high-frequency transmission line according to a preferred embodiment of the present invention is preferably configured as follows. In the first region of the high-frequency transmission line, the first ground conductor is configured to extend along the longitudinal direction, and configured to include two elongated conductors disposed at both ends in the width direction with a space between each other and configured to extend in the longitudinal direction, and a plurality of bridge conductors that connect between the two elongated conductors at intervals along the longitudinal direction. The second ground conductor is a conductor arranged to extend generally over the entire other end surface.

The configuration indicates a specific example of the configuration of the first region of the high-frequency transmission line. With such a configuration, the first ground conductor is structured such that a plurality of opening portions in which a conductor is not provided are arranged along the longitudinal direction. Thus, the proportion of the conductor occupying the first region is reduced compared to the dielectric element, which enables the first region to be easily curved or bent.

The second region of the high-frequency transmission line according to a preferred embodiment of the present invention is preferably configured so as to rotate a phase of a high-frequency signal by a predetermined amount through transmission between an input end and an output end.

According to the configuration, the second region further functions as a phase adjustment circuit. Thus, the input high-frequency signal is capable of being transmitted by the high-frequency transmission line to be output with a predetermined phase.

The high-frequency transmission line according to a preferred embodiment of the present invention is preferably configured as follows. In the second region of the high-frequency transmission line, the signal conductor is a conductor line with such a length that rotates the phase of the high-frequency signal by the predetermined amount. In the second region of the high-frequency transmission line, the first ground conductor is a conductor arranged to extend generally over the entire one end surface of the dielectric element.

According to the configuration, the second region of the high-frequency transmission line is implemented by a distributed constant line. Thus, the second region is configured to function as a phase adjustment circuit (delay line) with good frequency characteristics. In addition, the first ground conductor and the second ground conductor are so-called solidly filled conductors, which can make the second region harder and difficult to be curved or bent.

A high-frequency transmission line according to a preferred embodiment of the present invention is preferably configured as follows. The high-frequency transmission line further includes a third ground conductor provided in the second region of the high-frequency transmission line and arranged generally at the same position as the signal conductor in the thickness direction, the third ground conductor being configured to extend in parallel or substantially in parallel with the signal conductor with a generally constant gap therebetween, and the third ground conductor being connected to the first ground conductor at high frequencies.

According to the configuration, the conductor line constituting the phase adjustment circuit is surrounded by a ground. Thus, the characteristics of the phase adjustment circuit are capable of being set highly precisely, and a desired amount of phase rotation is achieved highly precisely.

In the high-frequency transmission line according to a preferred embodiment of the present invention, a width of the second region is preferably larger than a width of the first region.

According to the configuration, the second region has a large area, which makes the second region hard and difficult to be curved or bent.

The high-frequency transmission line according to a preferred embodiment of the present invention is preferably configured as follows. The second region of the high-frequency transmission line is provided at a plurality of locations along the longitudinal direction of the high-frequency transmission line, and a plurality of such second regions have generally the same variation width of the characteristic impedance.

According to the configuration, the plurality of second regions which are not curved or bent have generally the same characteristic impedance, which further stabilizes the characteristic impedance for the entire high-frequency transmission line.

A high-frequency transmission line according to a preferred embodiment of the present invention preferably further includes a second ground conductor disposed opposite to the first ground conductor with the signal conductor interposed therebetween.

Thus, a tri-plate transmission line is provided.

A high-frequency transmission line according to a preferred embodiment of the present invention preferably further include a connector member for connection to the signal conductor provided at at least one end in the longitudinal direction.

According to the configuration, the connector member is configured so that the high-frequency transmission line is easily connected to an external circuit board or the like.

Another preferred embodiment of the present invention provides an electronic device including any high-frequency transmission line according to the various preferred embodiments of the present invention discussed above, a plurality of circuit boards connected to each other by the high-frequency transmission line, and a housing that houses the circuit boards.

According to the configuration, the electronic device includes one of the high-frequency transmission lines described above. Use of the high-frequency transmission line discussed above allows transmission of a high-frequency signal between the circuit boards without increasing a transmission loss even if the high-frequency transmission line is used as curved or bent.

In an electronic device according to a preferred embodiment of the present invention, the high-frequency transmission line is preferably bent at least one location in the first region.

According to the configuration, arrangement modes of the high-frequency transmission line are increased. Further, the characteristic impedance of the high-frequency transmission line is constant in whichever arrangement mode is adopted to bend the high-frequency transmission line. Thus, the transmission characteristics for a high-frequency signal within the electronic device are improved.

According to various preferred embodiments of the present invention, the characteristic impedance for the entire flat cable is hardly varied even if the flat cable is partly curved. Thus, a flat cable with stable transmission characteristics that are not affected by the mode of use is provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 4A and 4B are each a graph illustrating the distribution characteristics of characteristic impedance along the longitudinal direction of the transmission line portion of the flat cable according to a preferred embodiment of the present invention.

FIGS. 14A and 14B are each a graph illustrating the distribution characteristics of characteristic impedance for explaining a problem caused with a flat cable structured in accordance with the related art.

DETAILED DESCRIPTION OF THE PREFERRED EMBODIMENTS

Figure 1:
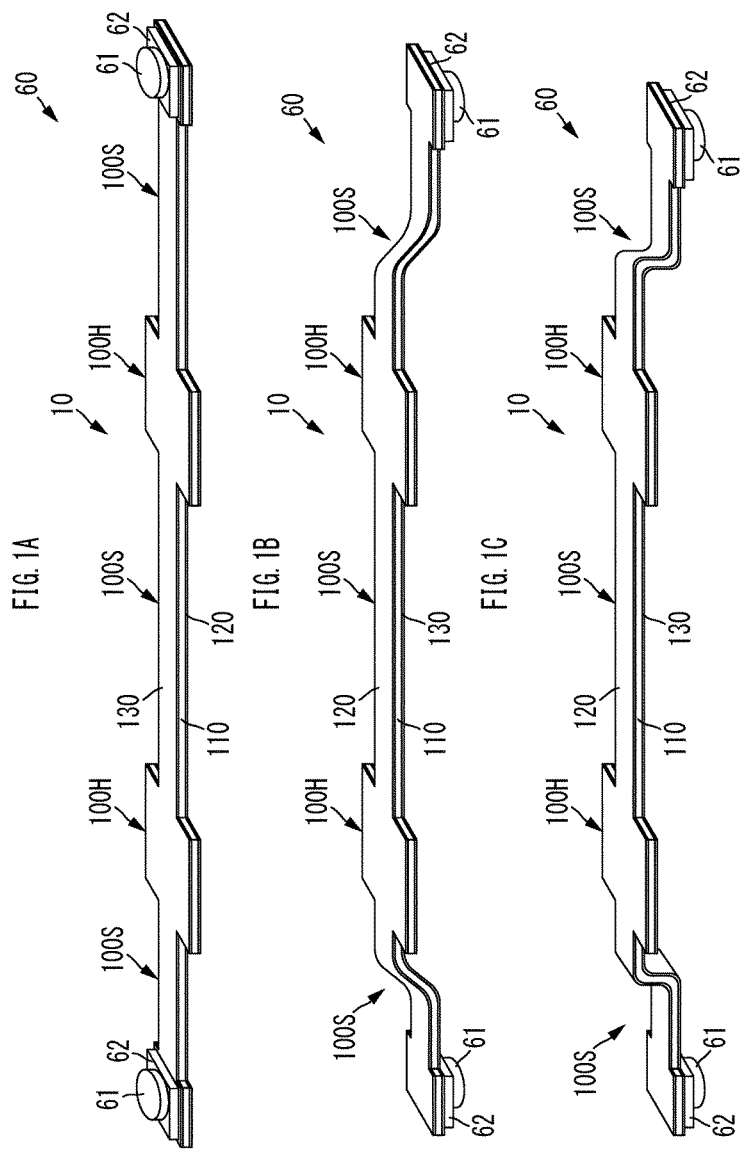
FIGS. 1A to 1C are each a perspective view illustrating the appearance of a flat cable according to a first preferred embodiment of the present invention.

A flat cable according to a first preferred embodiment of the present invention will be described with reference to the drawings. FIGS. 1A to 1C are each a perspective view illustrating the appearance of a flat cable which is a high-frequency transmission line according to the first preferred embodiment of the present invention. FIG. 1A illustrates a state in which the flat cable is not curved at all over the overall length. FIGS. 1B and 1C each illustrate a state in which the flat cable is partly curved, the flat cable being curved more greatly in FIG. 1C than in FIG. 1B. In FIG. 1A, the side on which coaxial connectors are disposed is defined as the upper surface. In FIGS. 1B and 1C, the side on which the coaxial connectors are disposed is defined as the lower surface.

Figure 2:
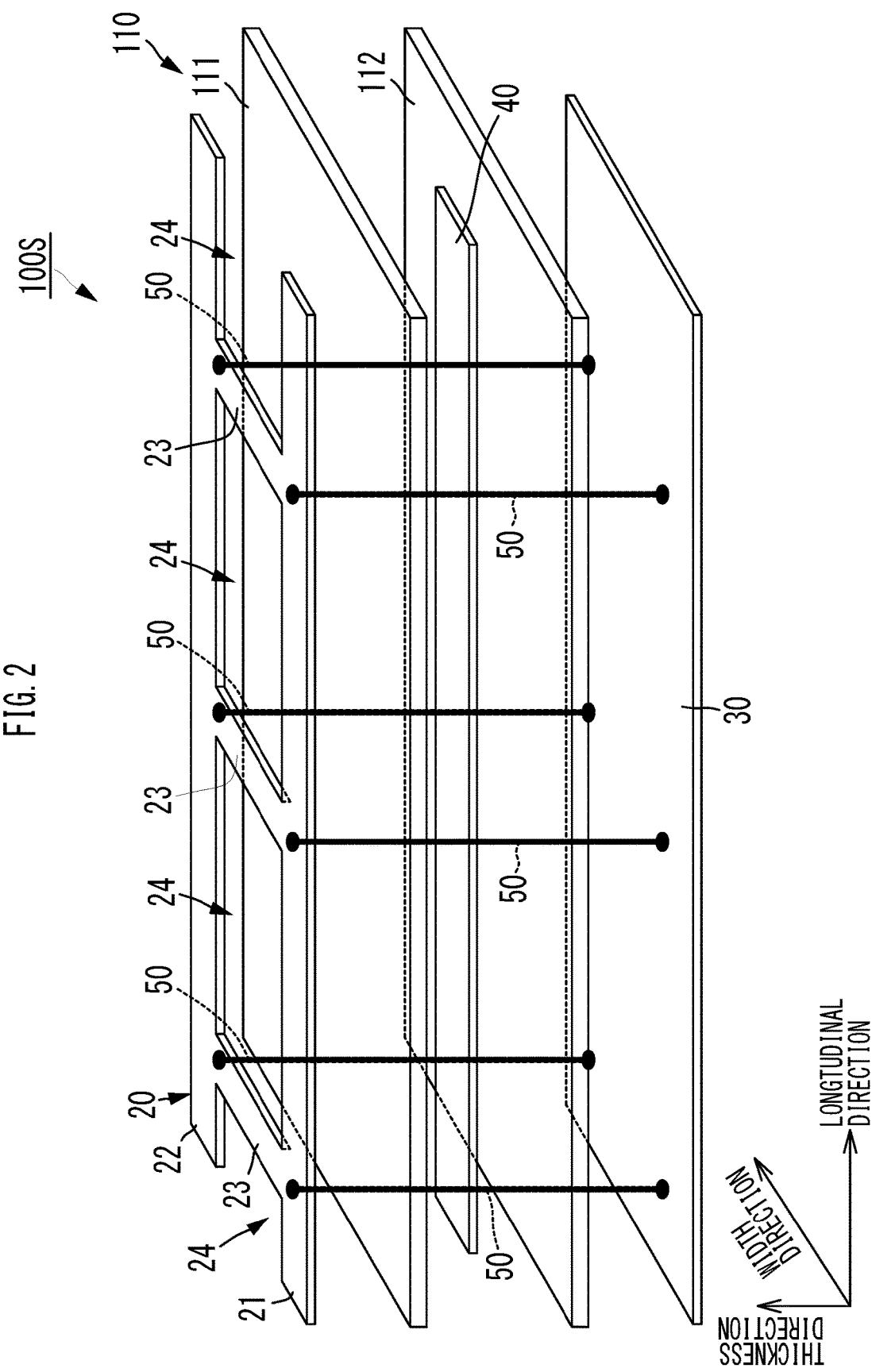
FIG. 2 is an exploded perspective view illustrating the structure of a first region of a transmission line portion of the flat cable according to the first preferred embodiment of the present invention.
Figure 3:
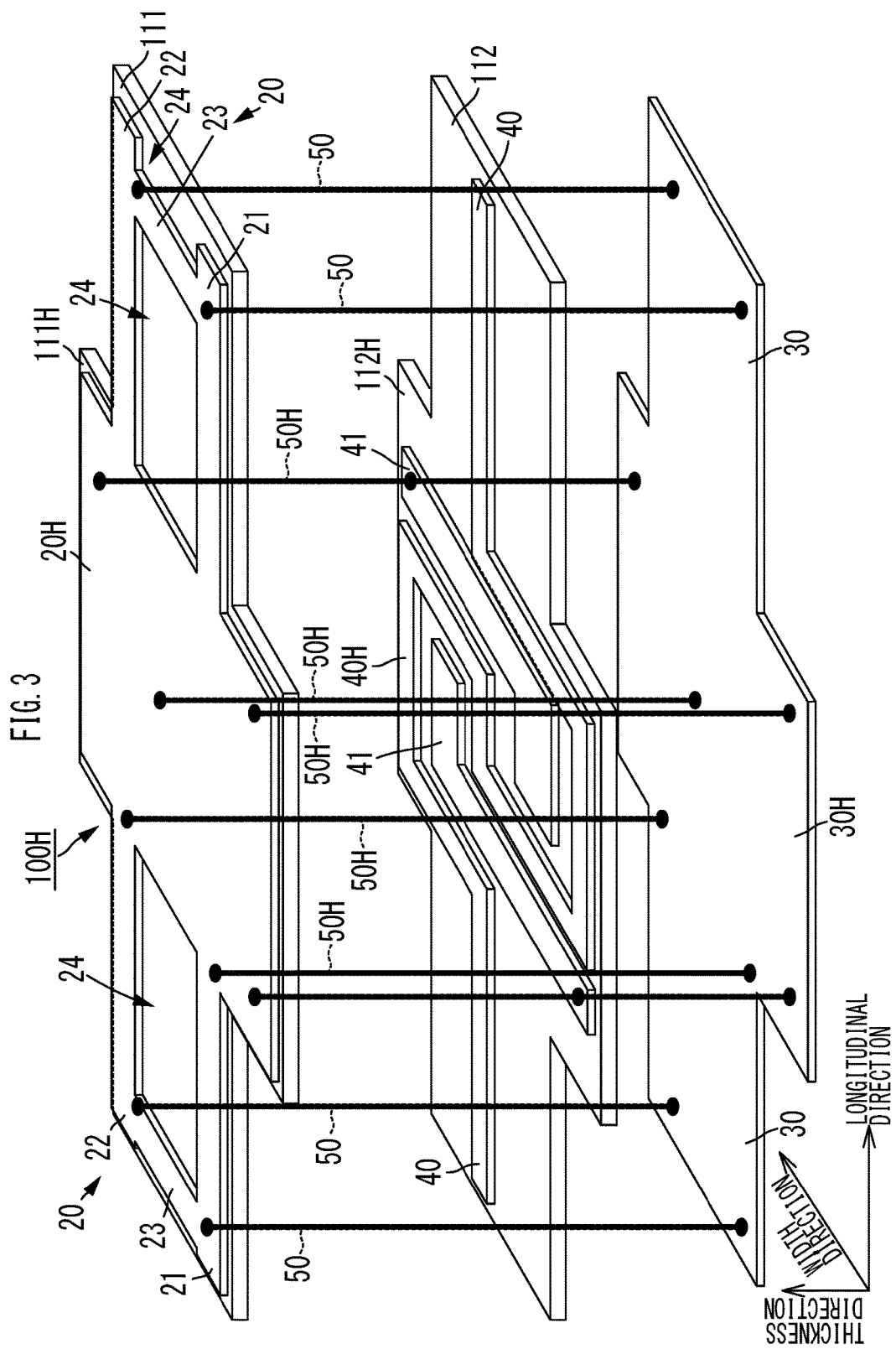
FIG. 3 is an exploded perspective view illustrating the structure of a second region of the transmission line portion of the flat cable according to the first preferred embodiment of the present invention.

FIG. 2 is an exploded perspective view illustrating the structure of a first region of a transmission line portion of the flat cable according to the first preferred embodiment of the present invention. FIG. 3 is an exploded perspective view illustrating the structure of a second region of the transmission line portion of the flat cable according to the first preferred embodiment of the present invention.

A flat cable 60 includes a transmission line portion 10 and coaxial connectors 61. The transmission line portion 10 has a flat and elongated shape. The transmission line portion 10 is configured such that a first region 100S, a second region 100H, a first region 100S, a second region 100H, and a first region 100S are continuously provided along the longitudinal direction.

Two coaxial connectors 61 are provided, and installed at both ends of the transmission line portion 10 in the longitudinal direction. The coaxial connectors 61 are installed on the side of a second principal surface (corresponding to the other surface according to the present invention) of the transmission line portion 10 via conversion pedestals 62. A center conductor (not illustrated) of the coaxial connector 61 is connected to an end portion of a signal conductor 40 (see FIGS. 2 and 3) of the transmission line portion 10. Meanwhile, an outside conductor (not illustrated) of the coaxial connector 61 is connected to a second ground conductor 30 of the transmission line portion 10. The coaxial connectors 61 and the conversion pedestals 62 may be omitted, and arrangements other than the coaxial arrangement may be adopted. In the case where the coaxial connectors 61 and the conversion pedestals 62 are omitted, portions of the signal conductor 40 around both ends of the transmission line portion 10 or a first ground conductor 20 and the second ground conductor 30 may be exposed to the outside. In addition, the coaxial connectors may be installed on different surfaces. For example, the coaxial connector 61 at one end may be installed on the side of the first principal surface, and the coaxial connector 61 at the other end may be installed on the side of the second principal surface.

As illustrated in FIGS. 1A to 1C, the transmission line portion 10 has an appearance in which a flat dielectric element 110 is sandwiched between a protective layer 120 and a protective layer 130 from both sides in the thickness direction of the dielectric element 110. Specifically, the protective layer 130 is arranged to extend generally over the entire surface of the dielectric element 110 on the side of the first principal surface which is an end surface of the dielectric element 110 on one side in the thickness direction. The protective layer 120 is arranged to extend generally over the entire surface of the dielectric element 110 on the side of the second principal surface which is an end surface of the dielectric element 110 on the other side in the thickness direction.

A specific structure of the first region 100S and the second region 100H constituting the transmission line portion 10 will be described next.

The first region 100S includes the dielectric element 110 including a first dielectric layer 111 and a second dielectric layer 112. The dielectric element 110 is a flexible flat plate having a predetermined thickness. The dielectric element 110 is elongated in a first direction along a flat-plate surface, and has a predetermined width in a direction along the flat-plate surface and perpendicular or substantially perpendicular to the longitudinal direction (first direction). The dielectric element 110 is preferably made of a flexible material such as polyimide or a liquid crystal polymer, for example.

The signal conductor 40 has a flat-film shape, and is provided between the first dielectric layer 111 and the second dielectric layer 112. The signal conductor 40 is preferably located generally in the center of the dielectric element 110 in the width direction. The width of the signal conductor 40 is smaller than the width of the dielectric element 110. More specifically, the width of the signal conductor 40 is smaller than the gap, in the width direction, between elongated conductors 21 and 22 constituting the first ground conductor 20 to be discussed later. The signal conductor 40 is preferably located in the middle of the dielectric element 110 in the thickness direction. The position of the signal conductor 40 in the thickness direction is set such that a characteristic impedance desired for the transmission line portion 10 is obtained. In other words, the thickness of first dielectric layer 111 and the second dielectric layer 112 is set such that a characteristic impedance desired for the transmission line portion 10 is obtained. The signal conductor 40 preferably is made of a highly electrically conductive material such as copper (Cu), for example.

The first ground conductor 20 is provided on the first principal surface (surface on the side of the first dielectric layer 111) of the dielectric element 110. However, if desired, the first ground conductor 20 may be provided in the dielectric element 110. The first ground conductor 20 includes the elongated conductors 21 and 22 and bridge conductors 23. The first ground conductor 20 preferably is also made of a highly electrically conductive material such as copper (Cu), for example.

The elongated conductors 21 and 22 have an elongated shape to extend along the longitudinal direction of the dielectric element 110. The elongated conductor 21 is preferably located at one end of the dielectric element 110 in the width direction. The elongated conductor 22 is preferably located at the other end of the dielectric element 110 in the width direction. The elongated conductors 21 and 22 are arranged with a predetermined gap therebetween along the width direction of the dielectric element 110.

The bridge conductors 23 are configured to extend in the width direction of the dielectric element 110. A plurality of bridge conductors 23 are arranged at intervals along the longitudinal direction of the dielectric element 110. Thus, opening portions 24 are located between the bridge conductors 23 as seen in the direction perpendicular or substantially perpendicular to the first principal surface (as seen along the thickness direction).

In this way, the first ground conductor 20 preferably has a ladder shape to extend in the longitudinal direction.

The second ground conductor 30 is provided on the second principal surface (surface on the side of the second dielectric layer 112) of the dielectric element 110. The second ground conductor 30 is arranged to extend generally over the entire surface of the dielectric element 110. The second ground conductor is also preferably made of a highly electrically conductive material such as copper (Cu), for example.

The first ground conductor 20 and the second ground conductor 30 are connected to each other by connection conductors 50. The connection conductors 50 are so-called electrically conductive via conductors, and penetrate the dielectric element 110 in the thickness direction. The connection conductors 50 are provided at positions of the first ground conductor 20 at which the elongated conductors 21 and 22 and the bridge conductors 23 are connected to each other.

In the thus configured first region 100S of the transmission line portion 10, the signal conductor 40 provided in the dielectric element 110 is sandwiched between the first ground conductor 20 and the second ground conductor 30. Thus, a so-called tri-plate transmission line is provided. In this case, the second ground conductor 30 which is a solidly filled conductor defines and serves as a reference ground, and the first ground conductor 20 with a ladder shape defines and serves as an auxiliary ground.

In the first region 100S, opening portions in which no conductor is provided are arranged at predetermined intervals along the longitudinal direction. Thus, for the first region 100S, the proportion of the conductor to the dielectric element 110 is lowered and the thickness of the dielectric element is reduced compared to a case where the first ground conductor is a solidly filled electrode as with the second ground conductor. Thus, the first region 100S is flexible, and is capable of being easily bent at a predetermined angle in the thickness direction with respect to a flat-plate surface of the flat cable.

The second region 100H includes a dielectric element 110H including a first dielectric layer 111H and a second dielectric layer 112H. The dielectric element 110H is a flexible flat plate having a predetermined thickness. The dielectric element 110H is preferably wider than the dielectric element 110 of the first region 100S. The width of the dielectric element 110H may be about the same as the width of the dielectric element 110 of the first region 100S.

The dielectric element 110H is preferably made of a flexible material such as polyimide or a liquid crystal polymer, for example. The first dielectric layer 111H is preferably integral with the first dielectric layer 111 of the first region 100S. The second dielectric layer 112H is preferably integral with the second dielectric layer 112 of the first region 100S. That is, the dielectric element 110H of the second region 100H is preferably integral with the dielectric element 110 of the first region 100S.

The second region 100H includes a meandering conductor 40H. The meandering conductor 40H is located between the first dielectric layer 111H and the second dielectric layer 112. Both ends of the meandering conductor 40H are connected to the signal conductor 40 of the first region 100S connected to the second region 100H. The meandering conductor 40H defines and functions as an inductor connected in series with a transmission line in a distributed constant circuit. The length of the meandering conductor 40H is set such that the phase of a high-frequency signal transmitted through the meandering conductor 40H is rotated by a desired phase amount. Use of such an inductor for a distributed constant circuit provides a phase adjustment circuit with good frequency characteristics that causes no variation in inductance according to the frequency. Thus, a transmission signal is transmitted with a low loss even in the case where the transmission signal has a predetermined frequency band.

The second region 100H includes a first ground conductor 20H. The first ground conductor 20H is provided on the first principal surface (surface on the side of the first dielectric layer 111H) of the dielectric element 110H. The first ground conductor 20H is arranged to extend generally over the entire first principal surface of the dielectric element 110H. That is, the first ground conductor 20H is a solidly filled conductor in the second region 100H. The first ground conductor 20H is also made of a highly electrically conductive material such as copper (Cu), for example. The first ground conductor 20H is preferably integral with the first ground conductor 20 of the first region 100S.

The second region 100H includes a second ground conductor 30H. The second ground conductor 30H is provided on the second principal surface (surface on the side of the second dielectric layer 112H) of the dielectric element 110H. The second ground conductor 30H is arranged to extend generally over the entire second principal surface of the dielectric element 110H. That is, the second ground conductor 30H is a solidly filled conductor in the second region 100H. The second ground conductor 30H is also preferably made of a highly electrically conductive material such as copper (Cu), for example. The second ground conductor 30H is preferably integral with the second ground conductor 30 of the first region 100S.

The first ground conductor 20H and the second ground conductor 30H are connected to each other by connection conductors 50H. The connection conductors 50H are so-called electrically conductive via conductors, and penetrate the dielectric element 110H in the thickness direction. A plurality of connection conductors 50H are provided in regions excluding a region in which the meandering conductor 40H is arranged to define the second region 100H is viewed in plan.

The thus configured second region 100H defines and functions as a phase adjustment circuit that rotates the phase of a high-frequency signal by a predetermined phase amount when the high-frequency signal is transmitted between adjacent first regions 100S connected to each other. Thus, a high-frequency signal input to the flat cable 60 is output after being adjusted to a predetermined phase. The second region 100H may be provided with a coil-shaped inductor pattern or capacitor pattern, and may be configured to define and function as a filter circuit such as a low-pass filter or a high-pass filter. In the case where a coil-shaped inductor pattern is provided, the impedance of the second region 100H is easily increased compared to the impedance at positions at which the bridge conductors 23 are located.

Further, the second region 100H according to the present preferred embodiment includes third ground conductors 41. The third ground conductors 41 are provided between the first dielectric layer 111H and the second dielectric layer 112H. In other words, the third ground conductors 41 are provided at the same position as the meandering conductor 40H along the thickness direction of the dielectric element 110H. The third ground conductors 41 are provided at a predetermined distance from the meandering conductor 40H to extend in parallel or substantially in parallel with the meandering conductor 40H. The third ground conductors 41 are connected to the first ground conductor 20H and the second ground conductor 30H by the connection conductors 50H. With such a configuration, the characteristics of the phase adjustment circuit implemented by the second region 200H are capable of being set highly precisely. Thus, a predetermined amount of phase rotation is capable of being provided to a high-frequency signal with higher precision. Further, the meandering conductor 40H is shielded from the external environment. Thus, leakage of extraneous radiation generated by the meandering conductor 40H to the outside is significantly reduced or prevented.

With the configuration according to the present preferred embodiment, in addition, in the second region 100H, the meandering conductor 400H is sandwiched between solidly filled conductors, and thus the proportion of the conductor to the dielectric element is increased. Thus, the second region 100H is harder than the first region 100S, and is difficult to be bent. With the configuration according to the preferred embodiment described above, further, the width of the second region 100H is larger than the width of the first region 100S, which makes the second region 100H harder and even more difficult to be bent.

When such a configuration is used, the transmission line portion 10 of the flat cable 60 has the following distribution characteristics of characteristic impedance along the longitudinal direction. FIGS. 4A and 4B are each a graph illustrating the distribution characteristics of characteristic impedance along the longitudinal direction of the transmission line portion 10 of the flat cable 60 according to the present preferred embodiment. FIG. 4A illustrates a state with no bend. FIG. 4B illustrates a state in which the first region 100S is bent.

In the first region 100S, the characteristic impedance is varied in cycles matching the interval of arrangement of the bridge conductors 23. Specifically, the characteristic impedance becomes minimum with the C property enhanced at positions of the bridge conductors 23 along the longitudinal direction, at which the bridge conductors 23 and the signal conductor 40 face each other in the thickness direction. The characteristic impedance becomes maximum with the L property enhanced most at positions between the bridge conductors 23 along the longitudinal direction, in other words, at the center positions of the opening portions 24 along the longitudinal direction. Thus, the variation width of the characteristic impedance, which is the difference between the maximum value and the minimum value of the characteristic impedance, in the first region 100S is ΔR0.

In the second region 100H, the meandering conductor 40H is preferably used, and thus the characteristic impedance becomes maximum with the L property enhanced most at the middle position in the extending direction of the meandering conductor 40H. On the other hand, the characteristic impedance becomes minimum with the C property enhanced at the boundary position between the second region 100H and the first region 100S, at which the signal conductor 40 and the first ground conductor 20H face each other. Thus, the variation width of the characteristic impedance, which is the difference between the maximum value and the minimum value of the characteristic impedance, in the second region 100H is ΔR1.

In this event, the length of the meandering conductor 40H can be set as appropriate to make the maximum value of the characteristic impedance in the second region 100H larger than the maximum value of the characteristic impedance in the first region 100S. Thus, the variation width ΔR1 of the characteristic impedance in the second region 100H is preferably larger than the variation width ΔR0 of the characteristic impedance in the first region 100S.

Further, the variation width ΔR1 of the characteristic impedance in the second region 100H is preferably set to be larger than the maximum value ΔR0' that the variation width ΔR0 of the characteristic impedance may take when the first region 100S is curved or bent.

With such a configuration, even if the first region 100S is curved or bent and the characteristic impedance in the first region 100S is varied, the maximum value of the variation width of the characteristic impedance for the transmission line portion 10 is the variation width ΔR1 of the characteristic impedance in the second region 100H.

Thus, the characteristic impedance for the transmission line portion 10 is hardly varied even if the first region 100S is curved or bent.

Thus, if the shape of various portions of the transmission line portion 10 is set so as to obtain a desired characteristic impedance Z0 with the distribution of the characteristic impedance in the first region 100S and the characteristic impedance in the second region 100H taken into consideration in advance, the characteristic impedance for the transmission line portion 10 is kept constant without being affected by a curve or a bend of the first region 100S. Thus, a flat cable with good transmission characteristics is achieved.

For example, the transmission characteristics are not degraded even if the flat cable 60 is utilized as curved at the first regions 100S as illustrated in FIGS. 1B and 1C, implementing a flat cable with good transmission characteristics.

The interval between the second regions 100H along the transmission direction, that is, the interval ("S" in FIG. 4A) between positions at which the absolute value of the impedance becomes largest, is preferably short. If the interval S is short, the frequency of a standing wave which affects the transmission-frequency characteristics of the transmission line portion 10 is increased. Thus, the transmission-frequency characteristics of the transmission line portion 10 in the frequency band of the transmission signal are improved by adjusting the interval S to be short to achieve a high frequency that is distant from the frequency of the high-frequency signal to be transmitted. That is, transmission characteristics with a low loss are provided in the frequency band of the transmission signal.

With the configuration according to the present preferred embodiment, further, the phase of the high-frequency signal is rotated by a predetermined phase amount. Thus, the high-frequency signal is supplied after being adjusted to a more appropriate phase in the case where the flat cable is connected to a circuit element with output characteristics that differ in accordance with the phase such as a high-frequency power amplifier. Thus, the characteristics (such as transmission signal output characteristics, for example) of a high-frequency module in which the flat cable is used are improved.

The connection conductors 50H in the second region 100H discussed above are preferably larger in diameter than the connection conductors 50 in the first region 100S. The number of the connection conductors 50H provided is preferably as large as possible. As the number of the connection conductors 50H is larger, the hardness of the second region 100H against a curve is enhanced.

The thus structured flat cable is manufactured as follows, for example.

First, a first insulating film to both surfaces of which copper is affixed and a second insulating film to one surface of which copper is affixed are prepared.

A first ground conductor 20 is formed by a patterning process at a portion on the side of the first principal surface of the first insulating film corresponding to the first region 100S. A first ground conductor 20H is formed by a patterning process at a portion on the side of the first principal surface of the first insulating film corresponding to the second region 100H.

A signal conductor 40 is formed by a patterning process at a portion on the side of the second principal surface of the first insulating film corresponding to the first region 100S. A meandering conductor 40H and third ground conductors 41 are formed by a patterning process at a portion on the side of the second principal surface of the first insulating film corresponding to the second region 100H.

A plurality of sets of the first ground conductors 20 and 20H, the signal conductor 40, the meandering conductor 40H, and the third ground conductors 41 are formed and arranged on the first insulating film.

A second ground conductor 30 is formed by a patterning process at a portion on the side of the second principal surface of the second insulating film corresponding to the first region 100S. A second ground conductor 30H is formed by a patterning process at a portion on the side of the second principal surface of the second insulating film corresponding to the second region 100H. A plurality of the second ground conductors 30 and 30H are formed and arranged on the second insulating film.

The first insulating film and the second insulating film are affixed to each other such that the first ground conductor 20 and the second ground conductor 30 face each other and the first ground conductor 20H and the second ground conductor 30H face each other. In this event, the first insulating film and the second insulating film are affixed to each other such that the signal conductor 40, the meandering conductor 40H, and the third ground conductors 41 are disposed between the first insulating film and the second insulating film. Thus, a plurality of complexes in which the first ground conductors 20 and 20H and the second ground conductors 30 and 30H are formed on both surfaces of a dielectric element including the signal conductor 40, the meandering conductor 40H, and the third ground conductors 41 provided at the middle position in the thickness direction can be obtained.

Individual transmission line portions 10 are cut out from the complexes. Protective layers 120 and 130 are formed on the transmission line portions 10. Coaxial connectors 61 are installed via conversion pedestals 62 at both ends of the transmission line portion 10 in the longitudinal direction, and on a surface of the transmission line portion 10 on which the protective layer 130 is formed.

Figure 5A:
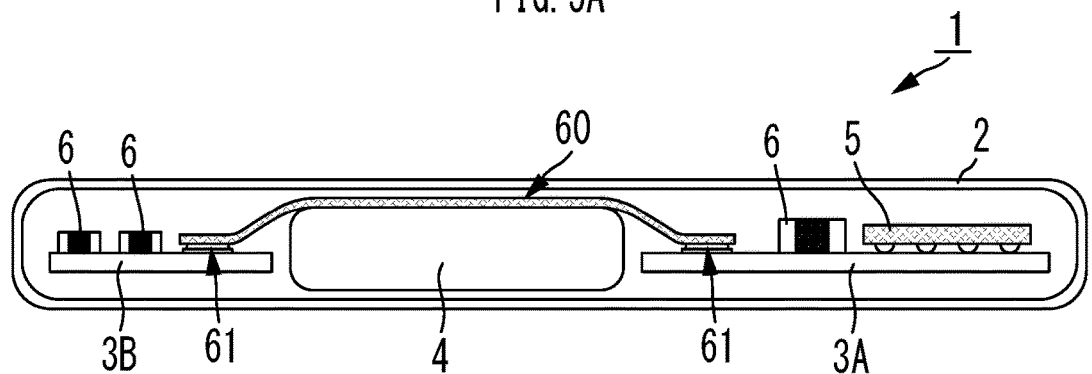
FIGS. 5A and 5B are a side sectional view and a plan sectional view, respectively, illustrating the partial configuration of a portable electronic device according to the first preferred embodiment of the present invention.
Figure 5B:
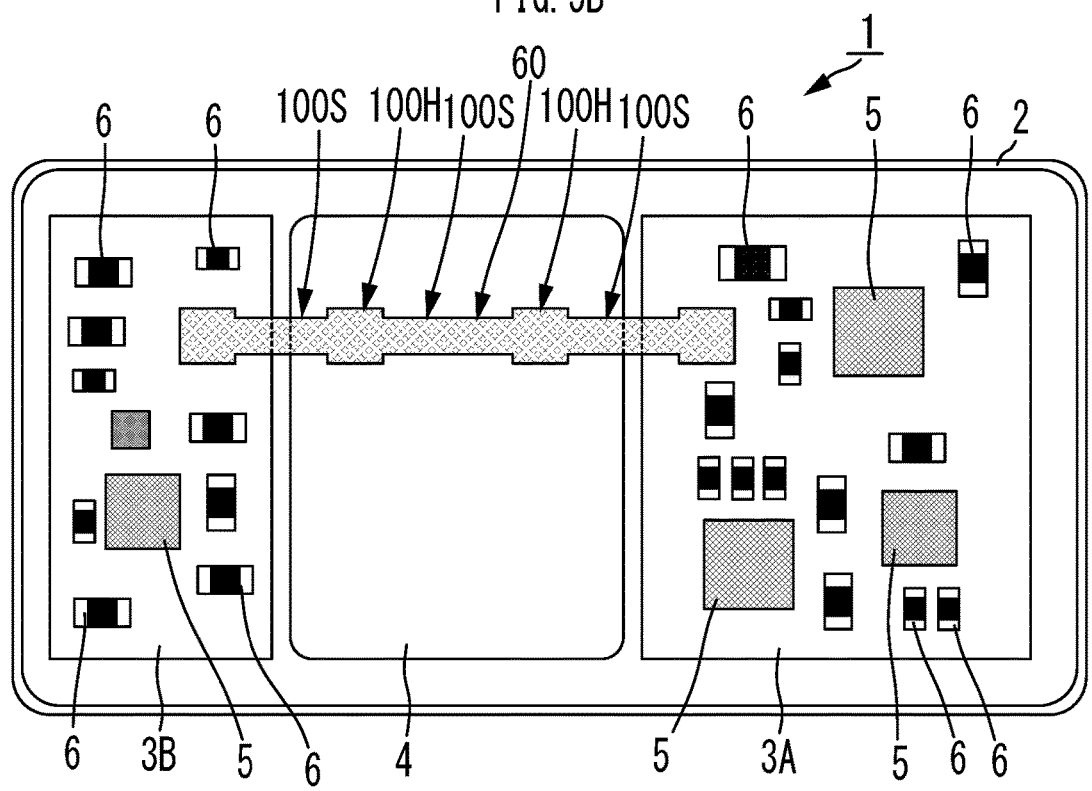

The flat cable 60 structured as discussed above can be used for the following portable electronic device. FIG. 5A is a side sectional view illustrating the configuration of a portable electronic device according to the first preferred embodiment of the present invention. FIG. 5B is a plan sectional view illustrating the configuration of the portable electronic device.

A portable electronic device 1 includes a thin device housing 2. Circuit boards 3A and 3B and a battery pack 4 are disposed in the device housing 2. A plurality of IC chips 5 and components 6 are mounted on surfaces of the circuit boards 3A and 3B. The circuit boards 3A and 3B and the battery pack 4 are installed in the device housing 2 such that the battery pack 4 is disposed between the circuit boards 3A and 3B as the device housing 2 is viewed in plan. The device housing 2 is preferably as thin as possible, and thus the gap between the battery pack 4 and the device housing 2 is extremely narrow in the thickness direction of the device housing 2. Thus, a coaxial cable cannot be disposed in the gap.

However, the flat cable 60 described in the present preferred embodiment preferably is disposed such that the thickness direction of the flat cable 60 and the thickness direction of the device housing 2 coincide with each other to allow the flat cable 60 to pass between the battery pack 4 and the device housing 2. Thus, the circuit boards 3A and 3B spaced from each other with the battery pack 4 disposed in the middle are connected to each other by the flat cable 60.

Further, even in the case where the position of connection of the flat cable 60 to the circuit boards 3A and 3B and a surface of the battery pack 4 for installation of the flat cable 60 are different in the thickness direction of the device housing 2 and the flat cable 60 is curved to be connected, a high-frequency signal is transmitted while suppressing a transmission loss by using the structure according to the present preferred embodiment.

Figure 6:
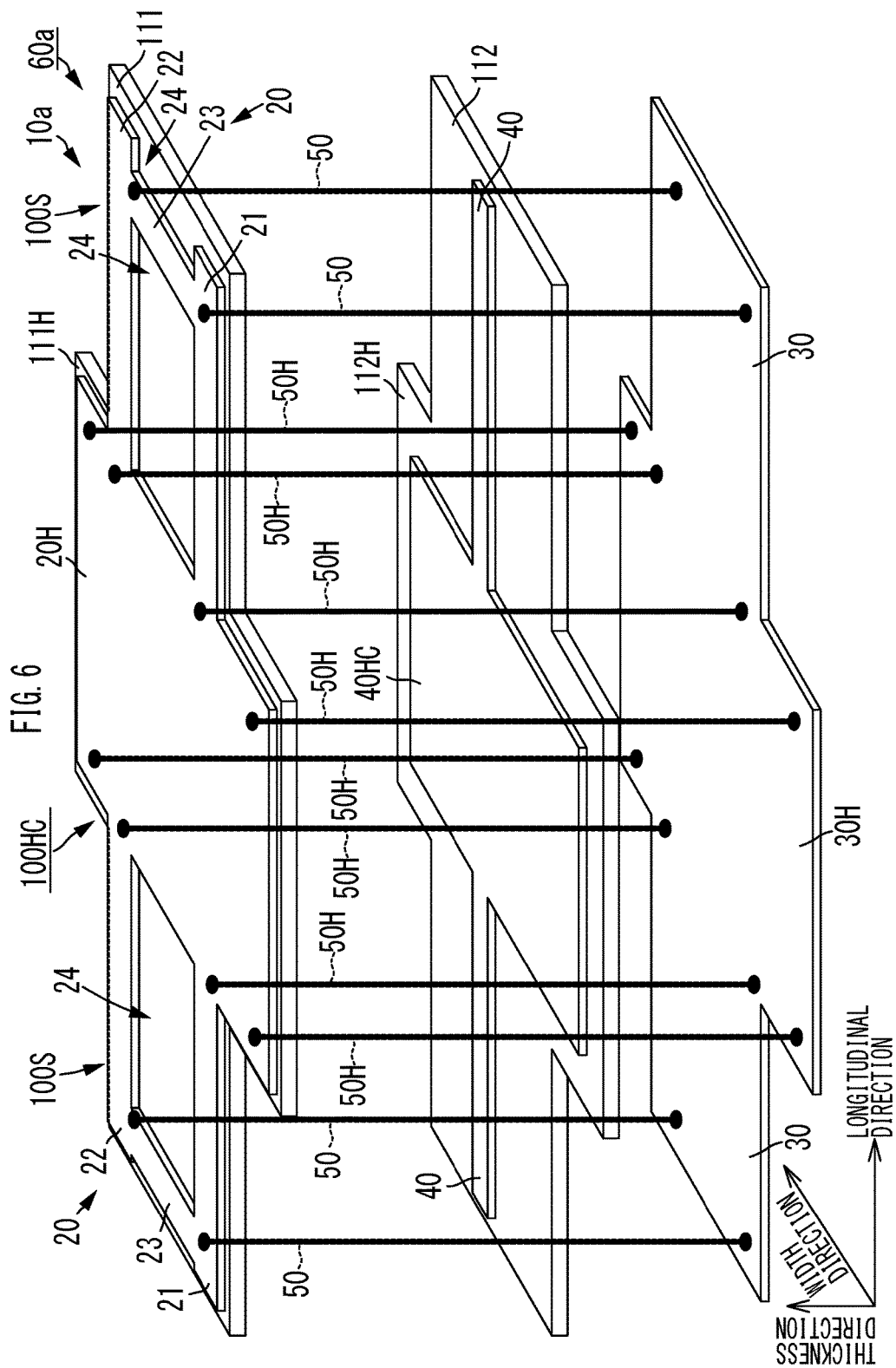
FIG. 6 is an exploded perspective view illustrating the structure of a second region of a transmission line portion of a flat cable according to a second preferred embodiment of the present invention.

Next, a flat cable which is a high-frequency transmission line according to a second preferred embodiment of the present invention will be described with reference to the drawings. FIG. 6 is an exploded perspective view illustrating the structure of a second region of a transmission line portion of the flat cable according to the second preferred embodiment of the present invention.

A transmission line portion 10a of a flat cable 60a according to the present preferred embodiment is different from the transmission line portion 10 described in the first preferred embodiment in the structure of a second region 100HC, and otherwise preferably is the same as the transmission line portion 10. Thus, only differences will be described.

The second region 100HC includes a flat-plate conductor 40HC provided between the first dielectric layer 111H and the second dielectric layer 112H. The flat-plate conductor 40HC is arranged to extend generally over the entire surface of the second region 100HC as seen along the thickness direction. The flat-plate conductor 40HC is a so-called solidly filled conductor.

A plurality of connection conductors 50H are arranged to connect between the first ground conductor 20H and the second ground conductor 30H at positions with no connection to the flat-plate conductor 40HC.

With such a configuration, the flat-plate conductor 40HC, the first ground conductor 20H and the second ground conductor 30H, and the first and second dielectric layers 111H and 112H define and function as a capacitor connected between the transmission line and the ground.

Even with such a configuration, a phase adjustment circuit that rotates the phase of a high-frequency signal is provided.

Figure 7:
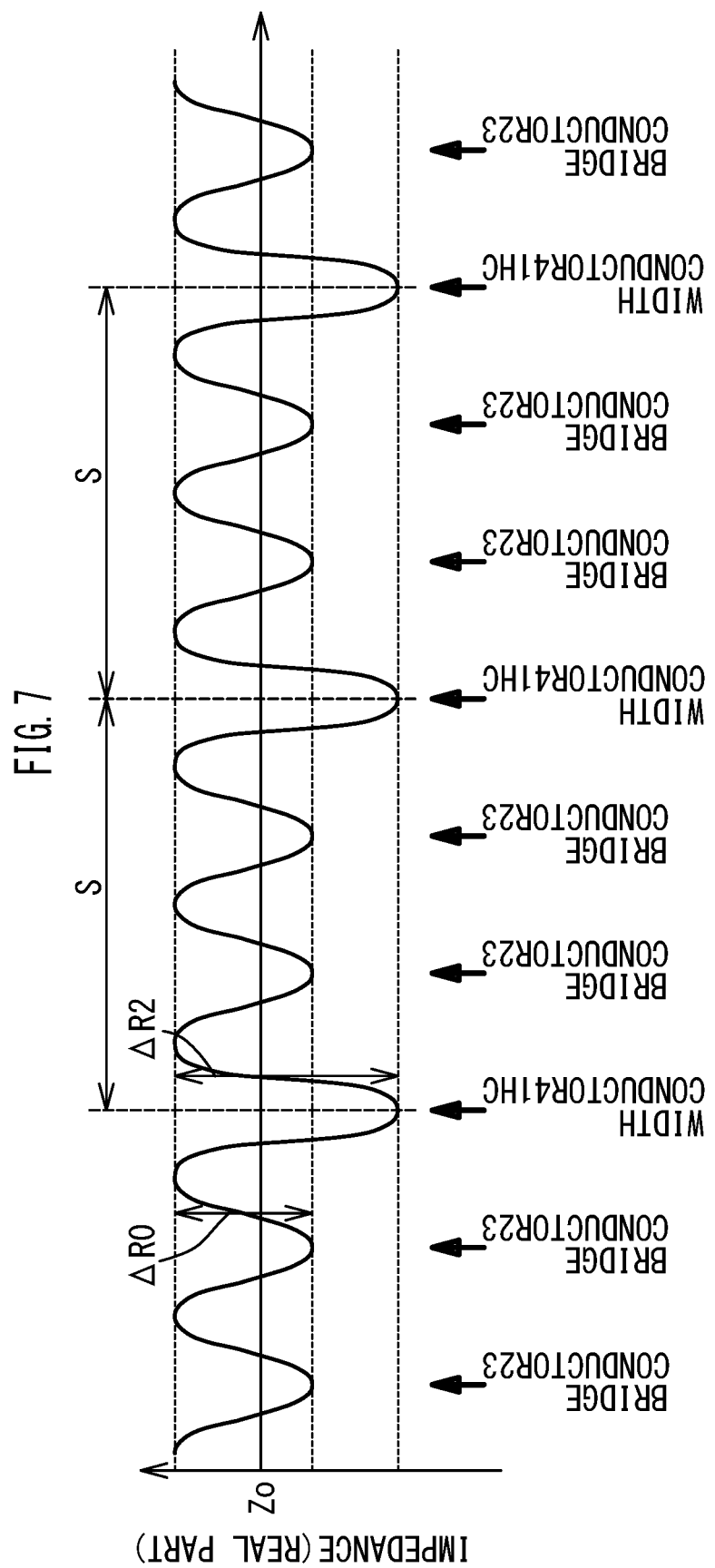
FIG. 7 is a graph illustrating the distribution characteristics of characteristic impedance along the longitudinal direction of the transmission line portion of the flat cable according to the second preferred embodiment of the present invention.

With such a configuration, the transmission line portion 10a of the flat cable 60a has the following distribution characteristics of characteristic impedance along the longitudinal direction. FIG. 7 is a graph illustrating the distribution characteristics of characteristic impedance along the longitudinal direction of the transmission line portion 10a of the flat cable 60a according to the second preferred embodiment of the present invention.

As in the first preferred embodiment, the variation width of the characteristic impedance, which is the difference between the maximum value and the minimum value of the characteristic impedance, in the first region 100S is ΔR0.

In the second region 100 HC, a capacitance is generated between the first ground conductor 20H and the second ground conductor 30H using the flat-plate conductor 40HC, which enhances the C property. Thus, the characteristic impedance is greatly reduced compared to that at the boundary position between the first region 100S and the second region 200HC to become minimum. Thus, the variation width of the characteristic impedance, which is the difference between the maximum value and the minimum value of the characteristic impedance, in the second region 100HC is ΔR2, which is larger than the variation width ΔR0 in the first region 100S.

Further, the variation width ΔR2 of the characteristic impedance in the second region 100HC is preferably set to be larger than the maximum value ΔR0' that the variation width ΔR0 of the characteristic impedance may take when the first region 100S is curved or bent.

With such a configuration, even if the first region 100S is curved or bent and the characteristic impedance in the first region 100S is varied, the maximum value of the variation width of the characteristic impedance for the transmission line portion 10a is the variation width ΔR2 of the characteristic impedance in the second region 100HC.

Thus, the characteristic impedance for the transmission line portion 10a is hardly varied even if the first region 100S is curved or bent.

Thus, if the shape of various portions of the transmission line portion 10a is set so as to obtain a desired characteristic impedance Z0 with the distribution of the characteristic impedance in the first region 100S and the characteristic impedance in the second region 100HC taken into consideration in advance, the characteristic impedance for the transmission line portion 10a can be kept constant without being affected by a curve or a bend of the first region 100S. Thus, a flat cable with good transmission characteristics is provided.

In the configuration according to the present preferred embodiment, further, the first and second dielectric layers 111H and 112H are sandwiched by the first ground conductor 20H, the flat-plate conductor 40HC, and the second ground conductor 30H, which are solidly filled electrodes, in the thickness direction. Thus, the second region 100HC is more resistant to being curved in the thickness direction. Thus, it is more difficult to curve the second region 100HC, and variations in characteristic impedance in the second region 100HC are significantly reduced or prevented.

The interval between the second regions 100H along the transmission direction, that is, the interval ("S" in FIG. 7) between positions at which the absolute value of the impedance becomes largest, is preferably short. If the interval S is short, the frequency of a standing wave which affects the transmission-frequency characteristics of the transmission line portion 10a is increased. Thus, the transmission-frequency characteristics of the transmission line portion 10a in the frequency band of the transmission signal is improved by adjusting the interval S to be short to achieve a high frequency that is distant from the frequency of the high-frequency signal to be transmitted. That is, transmission characteristics with a low loss are implemented in the frequency band of the transmission signal.

Figure 8:
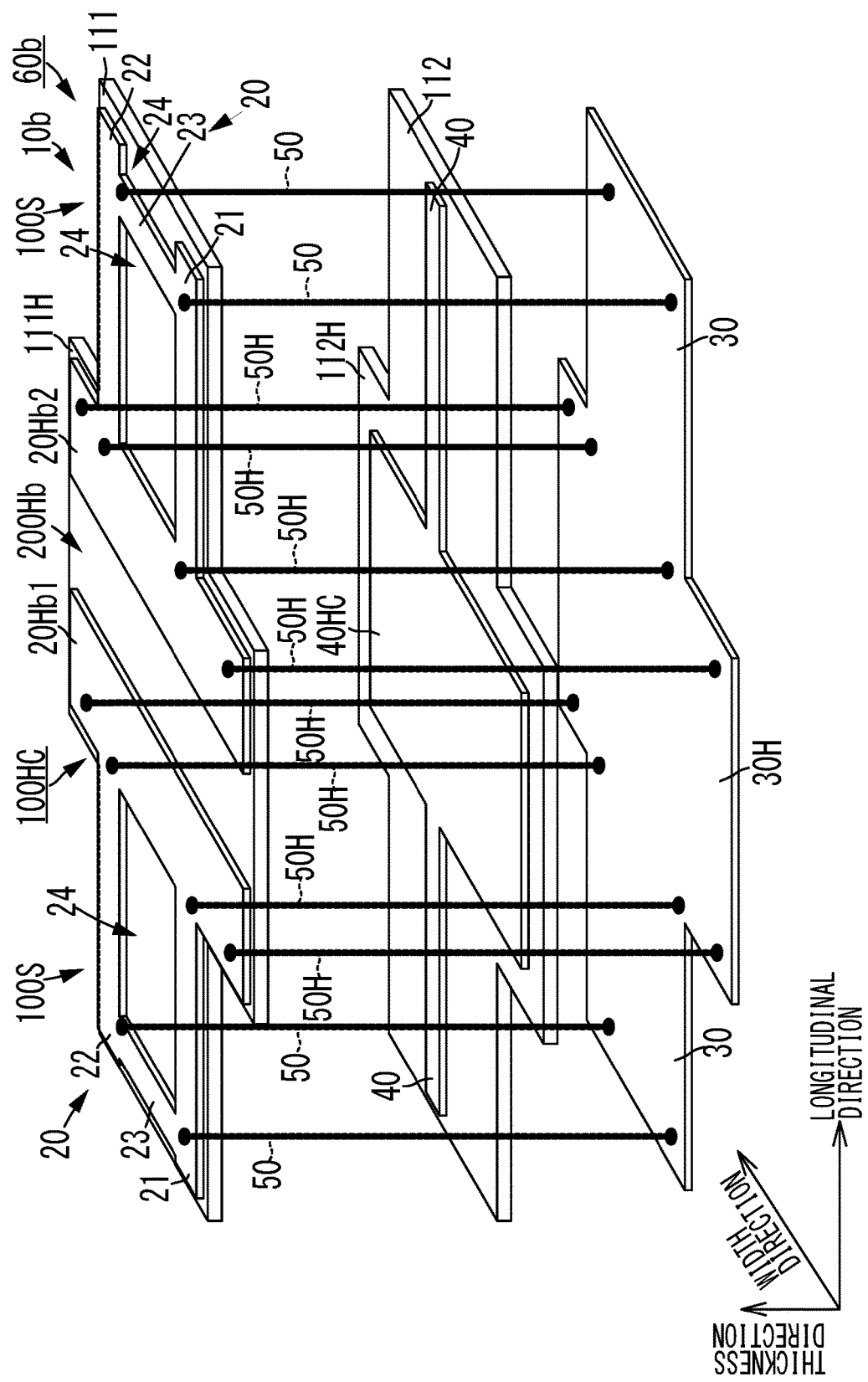
FIG. 8 is an exploded perspective view illustrating the structure of a second region of a transmission line portion of a flat cable according to a third preferred embodiment of the present invention.

Next, a flat cable which is a high-frequency transmission line according to a third preferred embodiment of the present invention will be described with reference to the drawings. FIG. 8 is an exploded perspective view illustrating the structure of a second region of a transmission line portion of the flat cable according to the third preferred embodiment of the present invention.

A transmission line portion 10b of a flat cable 60b according to the present preferred embodiment is different from the transmission line portion 10a described in the second preferred embodiment in the structure of the second region 100HC and the structure of the first dielectric layer, and otherwise preferably is the same as the transmission line portion 10a. Thus, only differences will be described.

First ground conductors 20Hb1 and 20Hb2 are provided on the first dielectric layer 111H of the second region 100HC. The first ground conductors 20Hb1 and 20Hb2 are flat-plate conductors. The first ground conductors 20Hb1 and 20Hb2 are spaced from each other with a predetermined gap 200Hb therebetween. In other words, the first ground conductor located in the second region 100HC is divided at an intermediate position along the transmission direction.

The first ground conductor 20Hb1 is connected to the elongated conductors 21 and 22 provided on one of the first dielectric layers 111 connected to the first dielectric layer 111H. The first ground conductor 20Hb2 is connected to the elongated conductors 21 and 22 provided on the other first dielectric layer 111 connected to the first dielectric layer 111H.

The first ground conductors 20Hb1 and 20Hb2 face the flat-plate conductor 40HC with the first dielectric layer 111H interposed therebetween.

The first ground conductors 20Hb1 and 20Hb2 are connected to the second ground conductor 30H via the individual connection conductors 50H. A plurality of connection conductors 50H are provided at positions with no connection to the flat-plate conductor 40HC.

With such a configuration, the first ground conductor 20Hb1 and the second ground conductor 30H constitute a capacitor, the first ground conductor 20Hb and the second ground conductor 30H constitute a capacitor, and the flat-plate conductor 40HC and the second ground conductor 30H constitute a capacitor. The capacitors define and function as a capacitor connected between the transmission line and the ground.

Even with such a configuration, functions and effects similar to those of the preferred embodiments discussed above are achieved. In the case where the configuration according to the preferred embodiment is used, the capacitance of the capacitor connected between the transmission line and the ground is capable of being adjusted by adjusting the shape of the gap 200Hb, in other words, by adjusting the shape of the first ground conductors 20Hb1 and 20Hb2.

In the present preferred embodiment, the first ground conductor preferably is divided. However, the second ground conductor may be divided.

Figure 9:
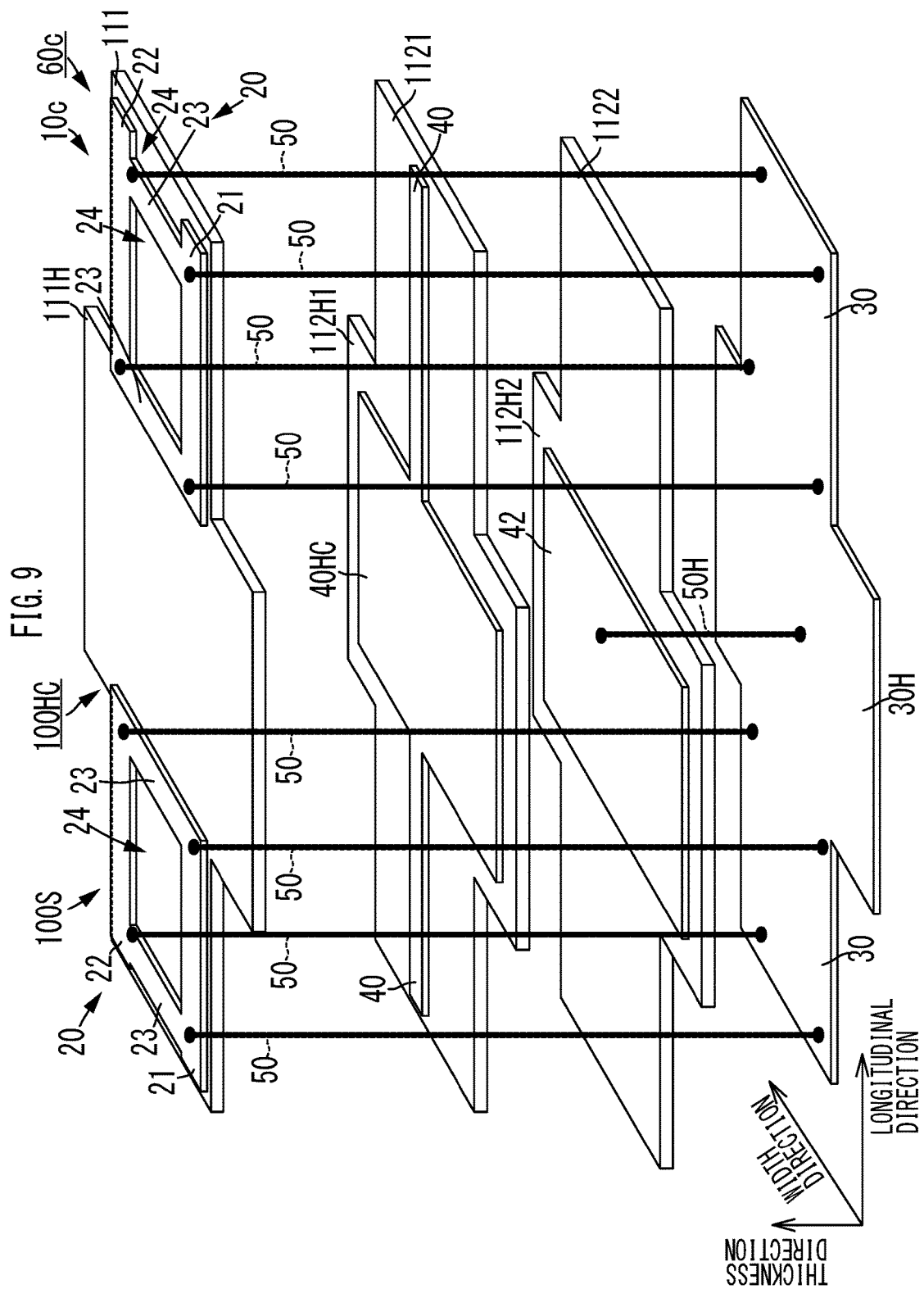
FIG. 9 is an exploded perspective view illustrating the structure of a second region of a transmission line portion of a flat cable according to a fourth preferred embodiment of the present invention.

Next, a flat cable which is a high-frequency transmission line according to a fourth preferred embodiment will be described with reference to the drawings. FIG. 9 is an exploded perspective view illustrating the structure of a second region of a transmission line portion of the flat cable according to the fourth preferred embodiment of the present invention.

A transmission line portion 10c of a flat cable 60c according to the present preferred embodiment is different from the transmission line portion 10a described in the second preferred embodiment in the structure of the first dielectric layer and the structure of the second region 100HC, and otherwise preferably is the same as the transmission line portion 10a. Thus, only differences will be described.

The second dielectric layer preferably has a two-layer structure with dielectric layers 1121 and 1122. The dielectric layer 1121 is disposed on the side of the first dielectric layer 111. The signal conductor 40 is located in the first region on the dielectric layer 1121 on the side of the first dielectric layer 111. The flat-plate conductor 40HC is located in the second region on the dielectric layer 1121 on the side of the first dielectric layer 111. A flat-plate conductor 42 is located in the second region on the dielectric layer 1122 on the side of the dielectric layer 1121. The flat-plate conductor 42 is arranged so as to face the flat-plate conductor 40HC over a predetermined area. The flat-plate conductor 42 is connected to the second ground conductor 30H via the connection conductor 50H.

No conductors (first ground conductors) are provided on the first dielectric layer 111H of the second region 100HC. The bridge conductors 23 which connect between the elongated conductors 21 and 22 are provided at end portions, on the side of the second region 100HC, on the first dielectric layer 111 of the first regions 100S which interpose the second region 100HC.

With such a configuration, the flat-plate conductor 40HC and the flat-plate conductor 42 (connected to the second ground conductor 30H) constitute a capacitor. The capacitor defines and functions as a capacitor connected between the transmission line and the ground.

With such a configuration, the capacitance generated between the flat-plate conductor 40HC and the second ground conductor is increased compared to a case where the flat-plate conductor 42 is not formed. The capacitance is capable of being adjusted by adjusting the shape of the flat-plate conductor 42. Further, the capacitance is capable of being adjusted by adjusting the thickness of the dielectric layer 1121 between the flat-plate conductors 40HC and 42.

In the present preferred embodiment, the flat-plate conductor 42 and the second ground conductor 30HC are connected to each other by the connection conductor 50H. However, the flat-plate conductor 40HC and the flat-plate conductor 42 may be connected to each other by a connection conductor, and the connection conductor between the flat-plate conductor 42 and the second ground conductor 30HC may be omitted. In this case, the capacitance is capable of being adjusted in accordance with the thickness of the dielectric layer 1122.

Figure 10:
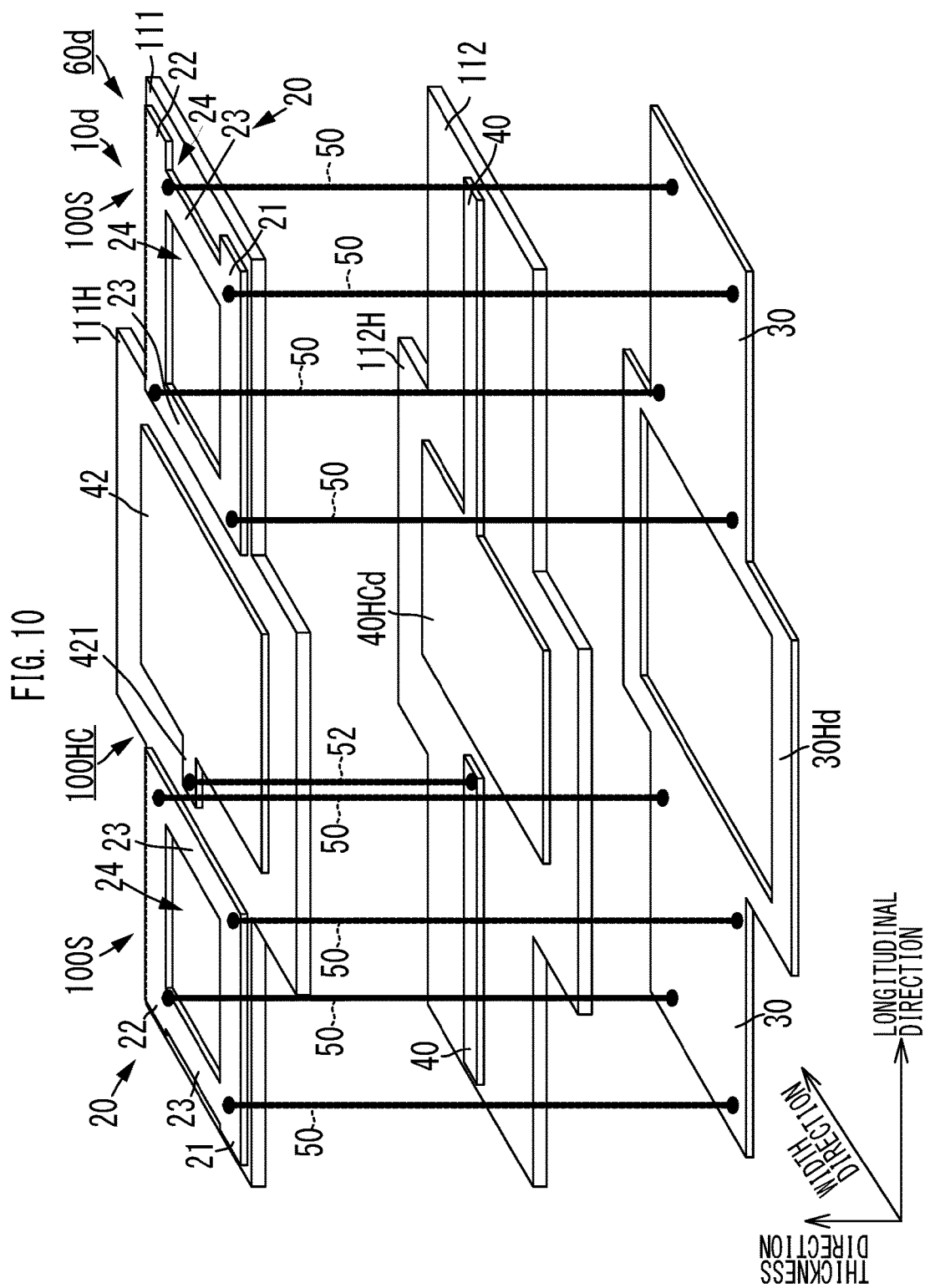
FIG. 10 is an exploded perspective view illustrating the structure of a second region of a transmission line portion of a flat cable according to a fifth preferred embodiment of the present invention.

Next, a flat cable which is a high-frequency transmission line according to a fifth preferred embodiment will be described with reference to the drawings. FIG. 10 is an exploded perspective view illustrating the structure of a second region of a transmission line portion of the flat cable according to the fifth preferred embodiment of the present invention.

A transmission line portion 10d of a flat cable 60d according to the present preferred embodiment is different from the transmission line portion 10a described in the second preferred embodiment in the structure of the second region 100HC, and otherwise preferably is the same as the transmission line portion 10. Thus, only differences will be described.

The flat-plate conductor 42 is provided on the first dielectric layer 111H in the second region 100HC. The flat-plate conductor 42 is arranged to extend generally over the entire surface of the first dielectric layer 111H excluding a region with a predetermined width along the outer periphery of the first dielectric layer 111H. The flat-plate conductor 42 is separated from the elongated conductors 21 and 22 formed on the first dielectric layer 111 of the first region 100S. A routing conductor 421 is connected to the flat-plate conductor 42. The routing conductor 421 is provided on the first dielectric layer 111H of the second region 100 HC.

The bridge conductors 23 which connect between the elongated conductors 21 and 22 are provided at end portions, on the side of the second region 100HC, on the first dielectric layer 111 of the first regions 100S which interpose the second region 100HC.

A flat-plate conductor 40HCd is provided on the second dielectric layer 112H in the second region 100HC. The flat-plate conductor 40HCd is also arranged to extend generally over the entire surface of the second dielectric layer 112H excluding a region with a predetermined width along the outer periphery of the second dielectric layer 112H. The flat-plate conductor 40HCd is connected to only the signal conductor 40 formed on one of the first regions 100S, and separated from the signal conductor 40 on the other first region 100S. The side on which the flat-plate conductor 42 is separated from the linear conductor 100 is the same as the side on which the routing conductor 421 is formed on the first dielectric layer 111H.

The signal conductor 40 on the separated side extends to the second region 100HC. The signal conductor 40 extending to the second region 100HC and the routing conductor 421 of the first dielectric layer 111H are connected to each other by a connection conductor 52.

With such a configuration, the flat-plate conductors 40HCd and 42 constitute a capacitor provided across the first dielectric layer 111H. The flat-plate conductor 40HCd is connected to one of the signal conductors 40, and the flat-plate conductor is connected to the other signal conductor 40. Thus, the capacitor defines and functions as a capacitor connected in series with the signal transmission line.

Further, a second ground conductor 30Hd of the second region 100HC is open except for a region with a predetermined width along the outer periphery discussed above. With such a configuration, the flat-plate surfaces of the flat-plate conductor 40HCd and the second ground conductor 30Hd do not face each other. Thus, almost no capacitive coupling is caused between the flat-plate conductor 40HCd and the second ground conductor 30Hd. Thus, in the case where only a series capacitor is required, such an opening is preferably provided. In the case where a parallel capacitor is also required, an opening is preferably not provided.

Figure 11:
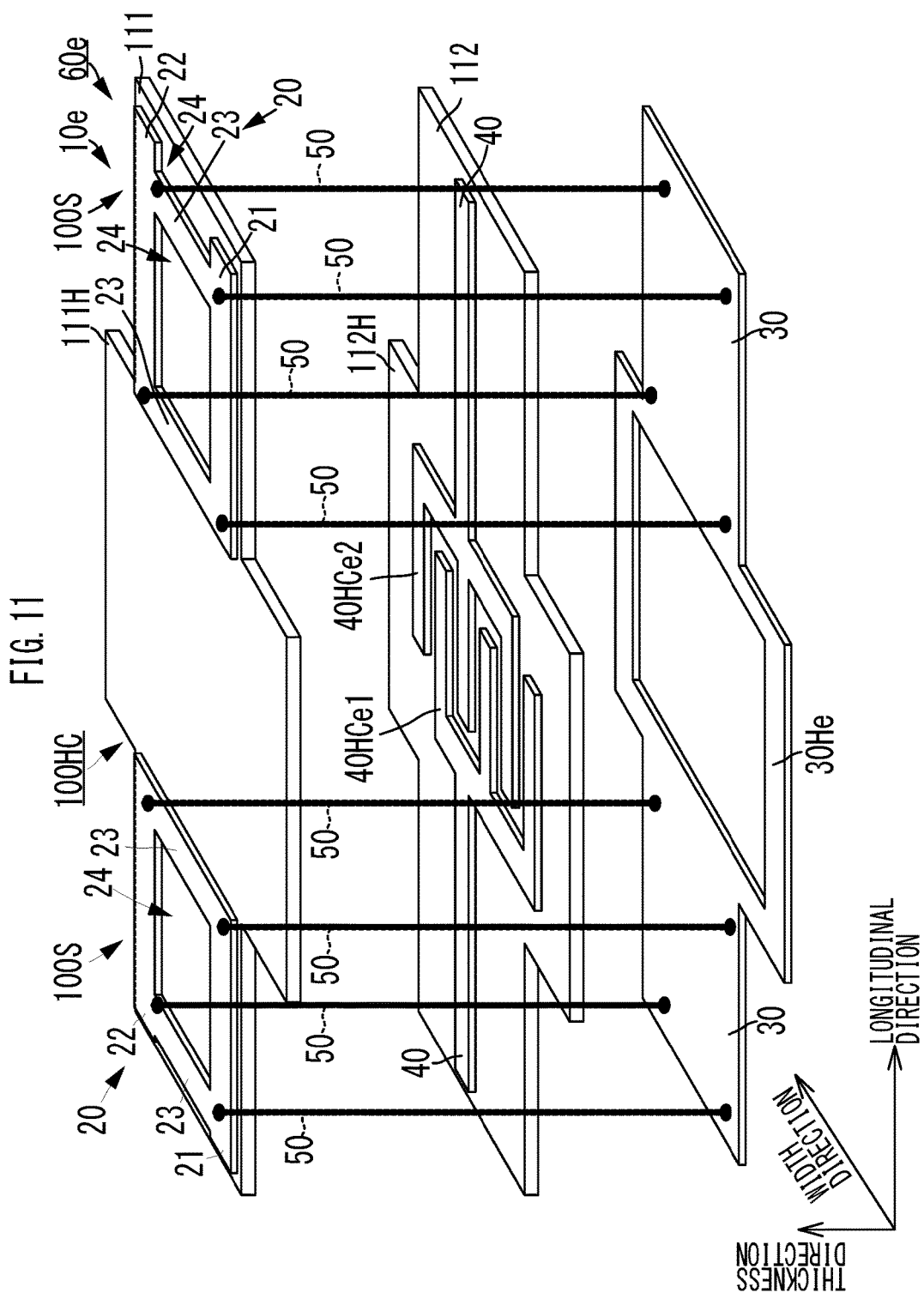
FIG. 11 is an exploded perspective view illustrating the structure of a second region of a transmission line portion of a flat cable according to a sixth preferred embodiment of the present invention.

Next, a flat cable which is a high-frequency transmission line according to a sixth preferred embodiment of the present invention will be described with reference to the drawings. FIG. 11 is an exploded perspective view illustrating the structure of a second region of a transmission line portion of the flat cable according to the sixth preferred embodiment of the present invention.

A transmission line portion 10e of a flat cable 60e according to the preferred embodiment is different from the transmission line portion 10a described in the second preferred embodiment in the structure of the second region 100HC, and otherwise preferably is the same as the transmission line portion 10a. Thus, only differences will be described.

A pair of comb-teeth conductors 40HCe1 and 40HCe2 are provided on the second dielectric layer 112H in the second region 100HC. The comb-teeth conductors 40HCe1 and 40HCe2 are connected to different signal conductors 40. The comb-teeth conductors 40HCe1 and 40HCe2 are disposed not to be connected to each other. In other words, conductive fingers of the comb-teeth conductors 40HCe1 and 40HCe2 are disposed at predetermined intervals in the width direction of the second dielectric layer 112H.

With such a configuration, a capacitance is generated between the conductive fingers of the comb-teeth conductors 40HCe1 and 40HCe2 so that the comb-teeth conductors 40HCe1 and 40HCe2 define and function as a capacitor. The capacitance is generated through coupling on the second dielectric layer 112H, that is, within an identical plane, and thus not easily varied under the influence of a conductor disposed outside the plane.

In the configuration, in addition, the capacitance is determined in accordance with the length of the conductive fingers provided opposite to each other, and therefore not affected by the thickness of the dielectric layer between the conductors constituting the capacitor. Thus, the design capacitance is achieved reliably and accurately.

With the configuration, in addition, the shielding performance against an external electromagnetic field is improved if the comb-teeth conductors 40HCe1 and 40HCe2 constituting the capacitor are interposed between the first ground conductor 20H and the second ground conductor 30H which are solidly filled conductors.

Figure 12:
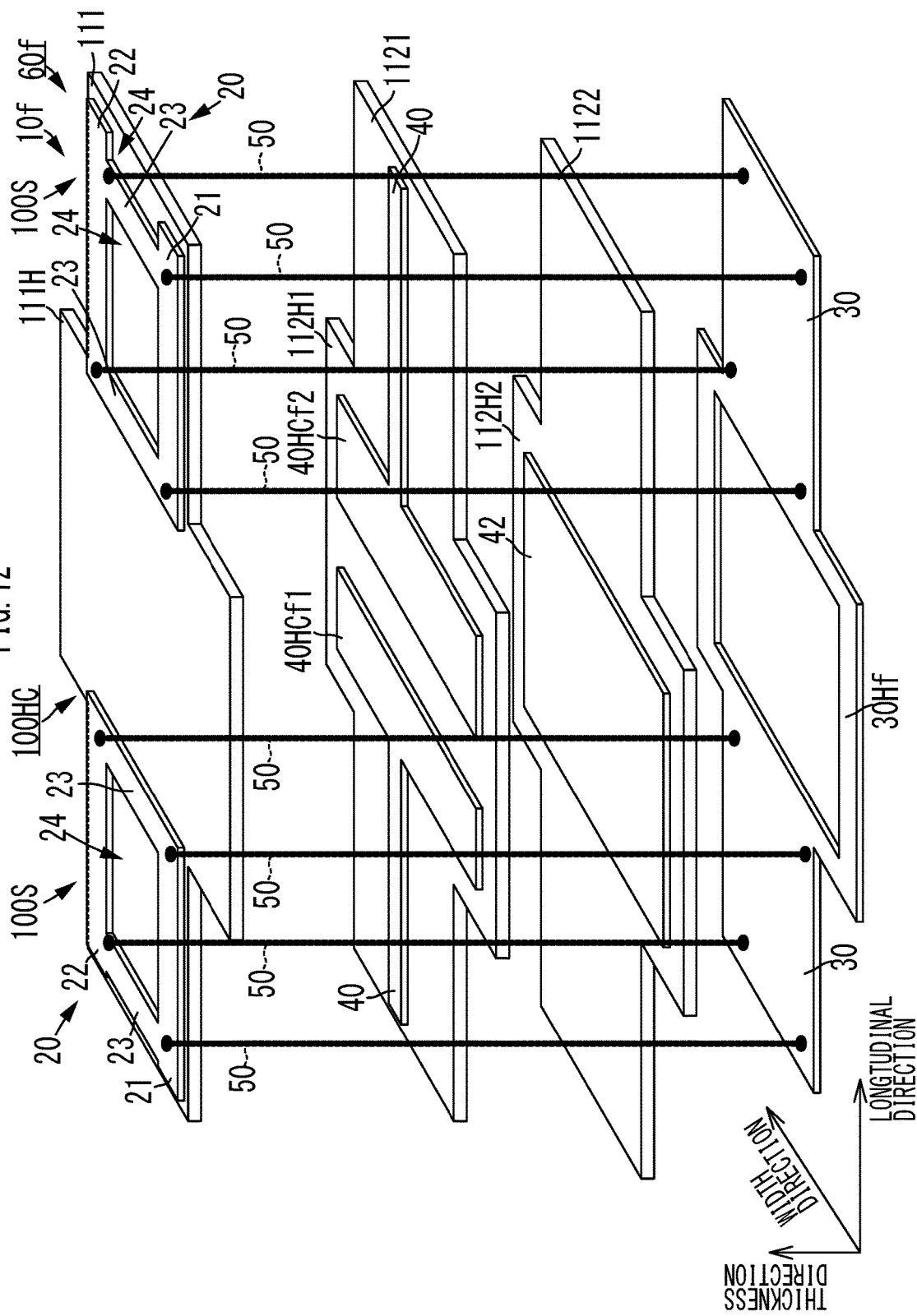
FIG. 12 is an exploded perspective view illustrating the structure of a second region of a transmission line portion of a flat cable according to a seventh preferred embodiment of the present invention.

Next, a flat cable which is a high-frequency transmission line according to a seventh preferred embodiment of the present invention will be described with reference to the drawings. FIG. 12 is an exploded perspective view illustrating the structure of a second region of a transmission line portion of the flat cable according to the seventh preferred embodiment of the present invention.

A transmission line portion 10f of a flat cable 60f according to the present preferred embodiment is different from the transmission line portion 10c described in the fourth preferred embodiment in the structure of the first dielectric layer and the structure of the second region 100HC, and otherwise preferably is the same as the transmission line portion 10c. Thus, only differences will be described.

The second dielectric layer preferably has a two-layer structure with dielectric layers 1121 and 1122. The dielectric layer 1121 is disposed on the side of the first dielectric layer 111. The signal conductor 40 is located in the first region 100S on the dielectric layer 1121 on the side of the first dielectric layer 111. Flat-plate conductors 40HCf1 and 40HCf2 are located in the second region 100HC on the dielectric layer 1121 on the side of the first dielectric layer 111. The flat-plate conductors 40HCf1 and 40HCf2 are separated from each other with a predetermined gap therebetween. The flat-plate conductors 40HCf1 and 40HCf2 are connected to different signal conductors 40.

A flat-plate conductor 42 is located in the second region 100HC on the dielectric layer 1122 on the side of the dielectric layer 1121. The flat-plate conductor 42 is arranged so as to face the flat-plate conductors 40HCf1 and 40HCf2 over a predetermined area.

No conductors (first ground conductors) are provided on the first dielectric layer 111H of the second region 100HC. The bridge conductors 23 which connect between the elongated conductors 21 and 22 are provided at end portions, on the side of the second region 100HC, on the first dielectric layer 111 of the first regions 100S which interpose the second region 100HC.

With such a configuration, the flat-plate conductors 40HCf1 and 42 face each other across the dielectric layer 1121 to constitute a capacitor. In addition, the flat-plate conductors 40HCf2 and 42 face each other across the dielectric layer 1121 to constitute a capacitor. Since the flat-plate conductors 40HCf1 and 40HCf2 are connected to different signal conductors 40, the capacitors define and function as two capacitors connected in series with the signal transmission line.

Further, a second ground conductor 30Hf of the second region 100HC is open except for a region with a predetermined width along the outer periphery discussed above. With such a configuration, the flat-plate surfaces of the flat-plate conductor 42 and the second ground conductor 30Hf do not face each other. Thus, almost no capacitive coupling is caused between the flat-plate conductor 42 and the second ground conductor 30Hf. Thus, in the case where only a series capacitor is required, such an opening is preferably provided. In the case where a parallel capacitor is also required, an opening is preferably not provided.

Figure 13:
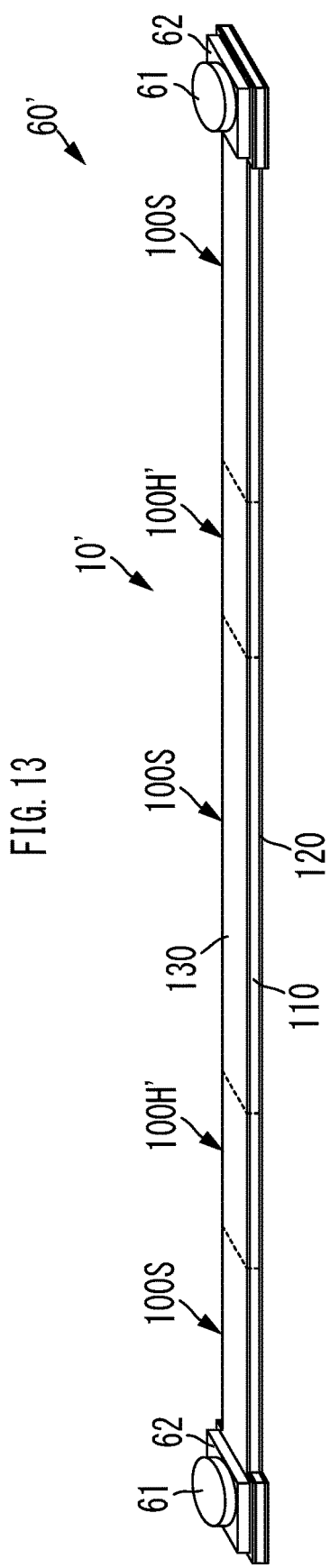
FIG. 13 is a perspective view illustrating the appearance of a flat cable with a constant width.

In the preferred embodiments discussed above, the second regions 100H and 100HC are wider than the first region 100S. However, the flat cable may have a constant width as illustrated in FIG. 13. FIG. 13 is a perspective view illustrating the appearance of a flat cable with a constant width. As illustrated in FIG. 13, a transmission line portion 10' of a flat cable 60' includes first regions 100S and second regions 100H' connected alternately. The first regions 100S and the second regions 100H' preferably have the same width as each other. Such a configuration with a constant width may be adopted if the rigidity of the second regions 100H' is higher than the rigidity of the first regions 100S.

In the preferred embodiments discussed above, the width of the opening portion 24 in the first region 100S preferably is constant, for example. However, the opening portion may be successively widened from an end portion connected to the bridge conductor toward the center in the longitudinal direction of the opening portion. Thus, abrupt variations in characteristic impedance in the first region are significantly reduced or prevented so as to further reduce or prevent a transmission loss.

In the preferred embodiments discussed above, the width of the signal conductor 40 in the first region 100S preferably is constant, for example. However, the signal conductor may be widened at a portion facing the opening portion. In this event, the signal conductor is not widened to such a degree that the signal conductor overlaps the elongated conductors as the flat cable is seen in the thickness direction. Thus, the high-frequency resistance of the signal conductor is reduced to reduce the conductor loss of the flat cable.

Although not specifically described in the preferred embodiments discussed above, a single second region may be provided rather than a plurality thereof. In the case where a plurality of second regions are provided, the second regions preferably have generally the same variation width of the characteristic impedance. Thus, the influence of the characteristic impedance in the second region on the flat cable is further increased to achieve a further stable characteristic impedance for the flat cable.

In the preferred embodiments discussed above, a phase adjustment circuit for the second region is preferably defined by a distributed constant circuit, for example. However, the phase adjustment circuit for the second region may be implemented by a lumped-constant circuit element, that is, a surface mount coil or a surface mount capacitor. In the case where a surface mount coil is used, for example, the signal conductor 40 is extended to the second region. The signal conductor 40 is cut in the second region. Two lands are provided on a surface of the first dielectric layer 111H, and connected to the two cut ends of the signal conductor 40 by a via conductor or the like. A surface mount coil is mounted to the two lands.

In the preferred embodiments discussed above, a tri-plate transmission line in which a signal conductor is disposed between a first ground conductor and a second ground conductor preferably is used. However, the configuration discussed above may also be applied to a microstrip transmission line from which a second ground conductor has been omitted.

In the preferred embodiments discussed above, the high-frequency transmission line is preferably in the form of a flat cable. However, the present invention is not limited to a flat cable. That is, preferred embodiments of the present invention may be used for a high-frequency transmission line that constitutes a portion of an RF circuit board such as an antenna front-end module.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency transmission line comprising:
 a flexible planar dielectric element elongated in one direction, the dielectric element having a predetermined width in a direction perpendicular or substantially perpendicular to a longitudinal direction and having a predetermined thickness;
 a signal conductor disposed in the dielectric element and configured to extend along the longitudinal direction; and
 a first ground conductor opposing the signal line conductor and extending in the longitudinal direction; wherein
 at least one of the signal conductor and the first ground conductor has a characteristic impedance cyclically varied along the longitudinal direction, and includes a first region and a second region with different variation widths of the characteristic impedance;
 the variation width of the characteristic impedance in the second region is larger than the variation width of the characteristic impedance in the first region; and a width of the second region of the dielectric element is larger than a width of the first region of the dielectric element.

2. An electronic device comprising:
the high-frequency transmission line according to claim 1;
a plurality of circuit boards connected to each other by the high-frequency transmission line; and
a housing that houses the circuit boards.

3. The electronic device according to claim 2, wherein in the first region, the first ground conductor is configured to extend along the longitudinal direction, and includes two elongated conductors disposed at both ends in the width direction with a space between each other and configured to extend in the longitudinal direction, and a plurality of bridge conductors that connect between the two elongated conductors at intervals along the longitudinal direction.

4. The electronic device according to claim 3, wherein the second region is configured to rotate a phase of a high-frequency signal by a predetermined amount through transmission between an input end and an output end.

5. The electronic device according to claim 4, wherein in the second region, the signal conductor is a conductor line with a length that rotates the phase of the high-frequency signal by the predetermined amount and the first ground conductor is a conductor arranged to extend over an entirety or substantially the entirety of one end surface of the dielectric element.

6. The electronic device according to claim 4, further comprising:
a third ground conductor provided in the second region and located at or substantially at a same position as the signal conductor in a thickness direction, the third ground conductor being configured to extend in parallel or substantially in parallel with the signal conductor with a constant or a substantially constant gap therebetween, and the third ground conductor being connected to the first ground conductor.

7. The electronic device according to claim 2, wherein the high-frequency transmission line is bent at at least one location in the first region.

8. The electronic device according to claim 2, wherein the second region is provided at a plurality of locations along the longitudinal direction, and a plurality of the second regions have the same or substantially the same variation width of the characteristic impedance.

9. The electronic device according to claim 2, further comprising a second ground conductor opposite to the first ground conductor with the signal conductor interposed therebetween.

10. The electronic device according to claim 2, further comprising a connector member configured to be connected to the signal conductor provided at at least one end in the longitudinal direction.

11. The high-frequency transmission line according to claim 1, wherein in the first region, the first ground conductor is configured to extend along the longitudinal direction, and includes two elongated conductors disposed at both ends in the width direction with a space between each other and configured to extend in the longitudinal direction, and a plurality of bridge conductors that connect between the two elongated conductors at intervals along the longitudinal direction.

12. The high-frequency transmission line according to claim 11, wherein the second region is configured to rotate a phase of a high-frequency signal by a predetermined amount through transmission between an input end and an output end.

13. The high-frequency transmission line according to claim 12, wherein in the second region, the signal conductor is a conductor line with a length that rotates the phase of the high-frequency signal by the predetermined amount and the first ground conductor is a conductor arranged to extend over an entirety or substantially the entirety of one end surface of the dielectric element.

14. The high-frequency transmission line according to claim 12, further comprising:
a third ground conductor provided in the second region and located at or substantially at a same position as the signal conductor in a thickness direction, the third ground conductor being configured to extend in parallel or substantially in parallel with the signal conductor with a constant or a substantially constant gap therebetween, and the third ground conductor being connected to the first ground conductor.

15. The high-frequency transmission line according to claim 1, wherein the second region is provided at a plurality of locations along the longitudinal direction, and a plurality of the second regions have the same or substantially the same variation width of the characteristic impedance.

16. The high-frequency transmission line according to claim 1, further comprising a second ground conductor opposite to the first ground conductor with the signal conductor interposed therebetween.

17. The high-frequency transmission line according to claim 1, further comprising a connector member configured to be connected to the signal conductor provided at at least one end in the longitudinal direction.

* * * * *